(12) United States Patent
Opower et al.

(10) Patent No.: US 8,248,581 B2
(45) Date of Patent: Aug. 21, 2012

(54) EXPOSURE SYSTEM

(75) Inventors: Hans Opower, Krailling (DE); Stefan Scharl, Wasserburg (DE)

(73) Assignee: KLEO AG, Appenzell (CH)

( * ) Notice: Subject to any disclaimer, the term of this patent is extended or adjusted under 35 U.S.C. 154(b) by 1035 days.

(21) Appl. No.: 12/229,501

(22) Filed: Aug. 21, 2008

(65) Prior Publication Data

US 2008/0316454 A1 Dec. 25, 2008

Related U.S. Application Data

(63) Continuation of application No. PCT/EP2007/001358, filed on Feb. 16, 2007.

(30) Foreign Application Priority Data

Feb. 22, 2006 (DE) .......................... 10 2006 008 080

(51) Int. Cl.
*G03B 27/54* (2006.01)

(52) U.S. Cl. .......................................... 355/67; 347/257

(58) Field of Classification Search .................. 347/224, 347/225, 233–235, 245, 250, 256–258, 263; 355/53, 67, 70, 72, 75
See application file for complete search history.

(56) References Cited

U.S. PATENT DOCUMENTS

| | | | |
|---|---|---|---|
| 1,030,522 A | 6/1912 | McFeely | |
| 3,610,119 A | 10/1971 | Gerber et al. | |
| 3,686,675 A * | 8/1972 | Faul et al. | 347/226 |
| 3,881,098 A | 4/1975 | Rich | |
| 4,455,485 A | 6/1984 | Hosaka et al. | |
| 4,541,712 A | 9/1985 | Whitney | |

(Continued)

FOREIGN PATENT DOCUMENTS

DE 37 08 147 9/1987

(Continued)

OTHER PUBLICATIONS

Grenon, B.J., et al., "A New Mask Lithography Tool for Advanced Mask Manufacturing," Microelectronic Engineering, Elsevier Publishers BV., Amsterdam, NL vol. 27, No. 1, Feb. 1, 1995, pp. 225-230.

*Primary Examiner* — Hung Henry Nguyen
*Assistant Examiner* — Steven H Whitesell Gordon
(74) *Attorney, Agent, or Firm* — Lipsitz & McAllister, LLC

(57) ABSTRACT

In the case of an exposure system for substrate bodies which carry a photosensitive coating on a substrate surface, comprising a machine frame, a substrate carrier which carries the substrate body and has a substrate carrier surface, and an exposure device with an optics unit, the optics unit and the machine frame being movable relative to one another in a first direction and in a second direction, so that the photosensitive coating can be exposed by this relative movement in the first direction and in the second direction, in order to improve said system in such a way that a compact configuration is possible, despite in this case a substrate body with a very large extent in the first and the second direction, it is proposed that the exposure device has a guide cross-member for at least one guide carriage of the exposure device, the guide carriage carrying the optics unit, in that the guide carriage is guided on the guide cross-member to be movable in the first direction, and in that the guide cross-member is arranged on the machine frame to be movable in the second direction.

76 Claims, 10 Drawing Sheets

U.S. PATENT DOCUMENTS

| | | | |
|---|---|---|---|
| 4,675,702 A | | 6/1987 | Gerber |
| 4,746,180 A * | | 5/1988 | Deisler et al. .................. 385/147 |
| 4,900,130 A * | | 2/1990 | Haas ........................... 359/198.1 |
| 5,164,742 A * | | 11/1992 | Baek et al. ..................... 347/234 |
| 5,175,435 A | | 12/1992 | Sakamoto et al. |
| 5,302,999 A | | 4/1994 | Oshida et al. |
| 5,343,271 A | | 8/1994 | Morishige |
| 5,385,092 A * | | 1/1995 | Lewis et al. ................... 101/467 |
| 5,495,279 A | | 2/1996 | Sandstrom |
| 5,504,407 A | | 4/1996 | Wakui et al. |
| 5,532,728 A * | | 7/1996 | Krams et al. .................. 347/257 |
| 5,546,225 A | | 8/1996 | Shiraishi |
| 5,580,698 A | | 12/1996 | Andersen |
| 5,652,660 A | | 7/1997 | Seto et al. |
| 5,812,152 A | | 9/1998 | Torigoe et al. |
| 5,812,892 A * | | 9/1998 | Miyoshi et al. ............... 396/548 |
| 5,862,278 A | | 1/1999 | Brauch et al. |
| 5,874,929 A | | 2/1999 | Opower et al. |
| 5,909,658 A | | 6/1999 | Clarke et al. |
| 6,002,466 A | | 12/1999 | Brauch et al. |
| 6,031,597 A * | | 2/2000 | Knirck et al. ................... 355/53 |
| 6,064,807 A | | 5/2000 | Arai et al. |
| 6,115,056 A * | | 9/2000 | Eshed ........................... 347/242 |
| 6,211,948 B1 | | 4/2001 | Luellau et al. |
| 6,268,929 B1 | | 7/2001 | Ono |
| 6,368,756 B1 | | 4/2002 | Yamada et al. |
| 6,407,765 B1 | | 6/2002 | Abe |
| 6,421,112 B1 | | 7/2002 | Bisschops et al. |
| 6,466,359 B2 * | | 10/2002 | Sunagawa ..................... 359/305 |
| 6,498,350 B2 | | 12/2002 | Kwan et al. |
| 6,519,387 B1 * | | 2/2003 | Sunagawa et al. ............. 385/33 |
| 6,535,271 B1 * | | 3/2003 | Ogasawara .................... 355/37 |
| 6,586,169 B2 | | 7/2003 | Brauch |
| 6,614,463 B2 * | | 9/2003 | Kerr et al. ..................... 347/241 |
| 6,717,097 B1 | | 4/2004 | Sandstrom et al. |
| 6,785,005 B2 | | 8/2004 | Inoue |
| 6,788,416 B2 | | 9/2004 | Reuter |
| 6,819,404 B2 | | 11/2004 | Tanaka |
| 6,833,854 B1 | | 12/2004 | Sandström |
| 6,870,604 B2 | | 3/2005 | Kanatake |
| 6,894,763 B2 | | 5/2005 | Murakami et al. |
| 6,903,798 B2 * | | 6/2005 | Shirota et al. ................... 355/18 |
| 7,019,818 B2 | | 3/2006 | Opower et al. |
| 7,705,967 B2 * | | 4/2010 | Opower et al. ................. 355/70 |
| 8,027,018 B2 | | 9/2011 | Opower et al. |
| 2002/0030733 A1 | | 3/2002 | Ressel et al. |
| 2002/0039179 A1 | | 4/2002 | Tanaka |
| 2002/0126479 A1 | | 9/2002 | Zhai et al. |
| 2002/0135745 A1 * | | 9/2002 | Fischer et al. ................... 355/67 |
| 2002/0167584 A1 * | | 11/2002 | Zelenka ........................ 347/234 |
| 2002/0180944 A1 * | | 12/2002 | Fujii et al. ....................... 355/70 |
| 2003/0053038 A1 * | | 3/2003 | Miyagawa ...................... 355/53 |
| 2003/0179279 A1 * | | 9/2003 | Uemura ........................ 347/235 |
| 2003/0214641 A1 | | 11/2003 | Uemura et al. |
| 2003/0218730 A1 | | 11/2003 | Murakami et al. |
| 2004/0027447 A1 * | | 2/2004 | Boqart et al. .................. 347/232 |
| 2005/0083509 A1 | | 4/2005 | Opower et al. |
| 2005/0157161 A1 * | | 7/2005 | Fukuda ......................... 347/239 |
| 2005/0213064 A1 | | 9/2005 | Katayama et al. |
| 2005/0282087 A1 | | 12/2005 | Opower et al. |
| 2006/0027538 A1 * | | 2/2006 | Ekberg et al. ............. 219/121.8 |
| 2007/0132832 A1 * | | 6/2007 | Oka et al. ...................... 347/241 |

FOREIGN PATENT DOCUMENTS

| | | |
|---|---|---|
| EP | 0 052 892 | 6/1982 |
| EP | 0 557 100 | 8/1993 |
| EP | 0 845 710 | 6/1998 |
| EP | 1 052 549 | 11/2000 |
| EP | 1 122 609 | 8/2001 |
| EP | 1 319 984 | 6/2003 |
| EP | 1 615 075 | 1/2006 |
| WO | 95/22787 | 8/1995 |
| WO | 99/27569 | 6/1999 |
| WO | 01/18606 | 3/2001 |
| WO | 03/079115 | 9/2003 |
| WO | 2004/029721 | 4/2004 |
| WO | 2004/074940 | 9/2004 |

* cited by examiner

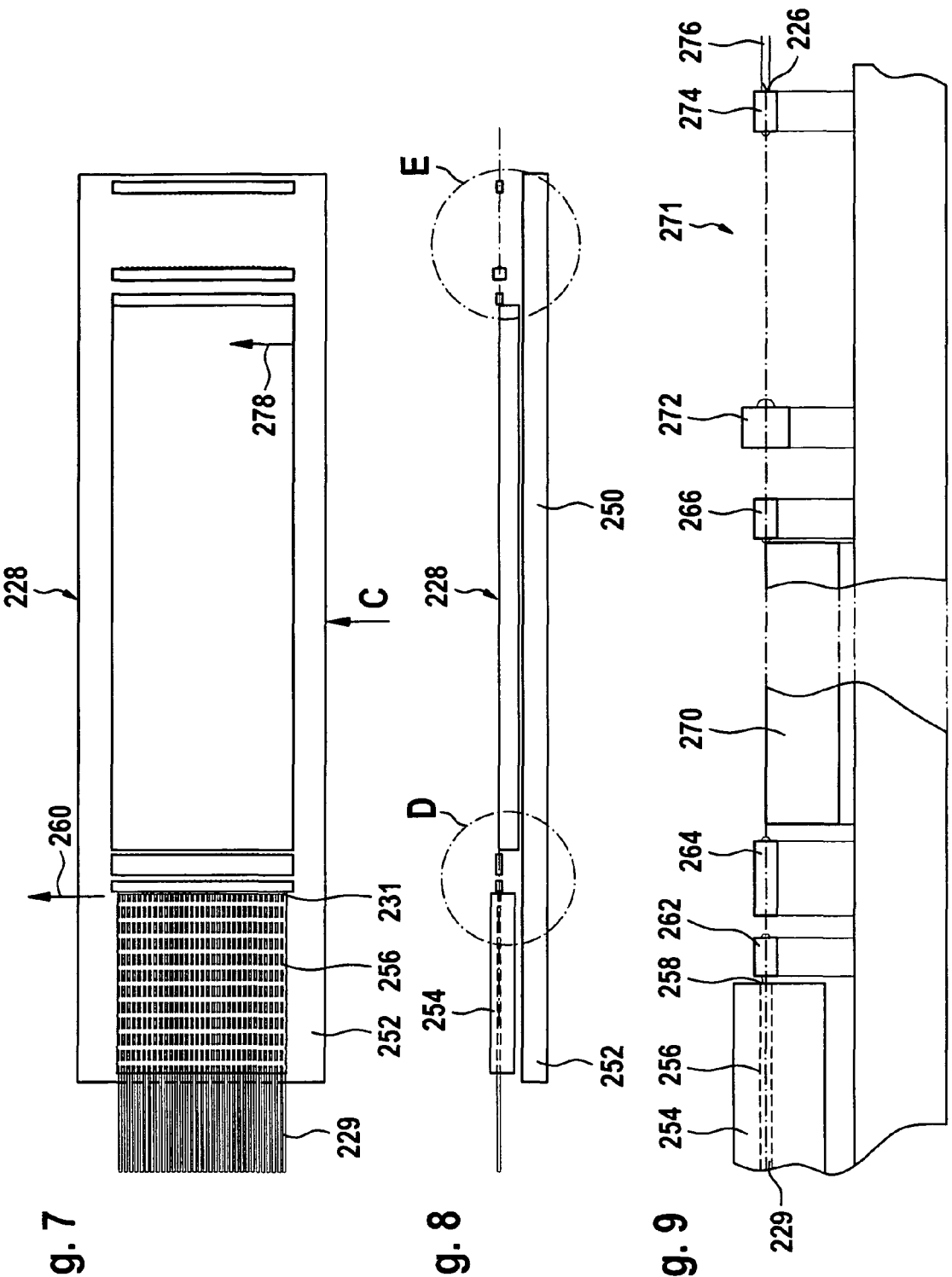

EXPOSURE SYSTEM

This application is a continuation of International application No. PCT/EP2007/001358 filed on Feb. 16, 2007.

This patent application claims the benefit of International application No. PCT/EP2007/001358 of Feb. 16, 2007 and German application No. 10 2006 008 080.7 of Feb. 22, 2006, the teachings and disclosure of which are hereby incorporated in their entirety by reference thereto.

BACKGROUND OF THE INVENTION

The invention relates to an exposure system for substrate bodies which carry a photosensitive coating on a substrate surface, comprising a machine frame, a substrate carrier which carries the substrate body and has a substrate carrier surface, and an exposure device with an optics unit, the optics unit and the machine frame being movable relative to one another in a first direction, which is parallel to the substrate carrier surface, and in a second direction, which is parallel to the substrate carrier surface and runs transversely with respect to the first direction, so that the photosensitive coating can be exposed locally selectively by means of exposure spots, which can be produced by means of the optics unit, by virtue of this relative movement in the first direction and in the second direction.

Exposure systems such as these are known from the prior art, for example from EP 1 319 984 A.

In these exposure systems, the substrate is itself moved along at least one axis, in order to achieve the relative movement with respect to the optics unit.

However, particularly in the case of large substrates, this means that a large amount of space is therefore required for the exposure system.

The invention is therefore based on the object of improving an exposure system of the generic type in such a manner that a compact configuration is possible, despite in this case a substrate body with a very large extent in the first and the second direction.

SUMMARY OF THE INVENTION

In the case of an exposure system of the type described initially, this object is achieved according to the invention in that the exposure device has a guide cross-member for at least one guide carriage of the exposure device, the guide carriage carrying the optics unit, in that the guide carriage is guided on the guide cross-member to be movable in the first direction, and in that the guide cross-member is arranged on the machine frame to be movable in the second direction.

The advantage of the solution according to the invention is that the relative movement can be produced in a simple manner, with little space being required for the exposure system, by the movement of the guide cross-member itself and by the movement of the optics unit along the guide cross-member.

In this case, it is particularly advantageous if the guide cross-member is movably mounted on the machine frame by means of feet elements which form air bearings, since this allows the guide cross-member to be moved without wear and freely.

In order to improve the precision of the exposure of the photosensitive coating, the invention preferably provides that the guide cross-member can be fixed relative to the machine frame against movement in the second direction. This makes it possible to carry out measurement procedures or exposure procedures with high precision, with the guide cross-member stationary.

In this case, it would be conceivable to provide braking devices for fixing the guide cross-member to the machine frame.

However, in one particularly simple solution, the guide cross-member can be fixed on the machine frame by setting feet elements down onto the machine frame.

It is particularly advantageous if the air bearing feature for the feet elements of the guide cross-member, which form the air bearing, can be switched off in order for the feet elements to be set down onto running surfaces on the machine frame, which are provided for the feet elements.

Theoretically, when the feet elements are set down, they could be fixed in a positively locking manner relative to the machine frame.

However, it is particularly advantageous if the feet elements which are set down onto the machine frame fix the guide cross-member with a force fit relative to the machine frame, thus allowing fixing in any desired position.

No further details have yet been provided with regard to the functions to be carried out when the guide cross-member is fixed.

A particularly advantageous solution provides that the guide cross-member can be fixed relative to the machine frame in order to effect an exposure of the photosensitive coating, that is to say that the exposure of the photosensitive coating is in this case effected with the guide cross-member fixed relative to the machine frame. This solution has the major advantage that it results in the guide cross-member being positioned precisely and in a stable manner relative to the machine frame, thus making it possible to improve the exposure precision, in particular also in that forces which are introduced on the guide cross-member, for example as a result of acceleration of the guide carriages, are also absorbed by the machine frame, thus considerably reducing the disturbing effects of these forces on the positioning of the optics unit as precisely as possible relative to the photosensitive coating.

Particularly high exposure precision is ensured if the exposure of all of the high-precision structures is effected only with the guide cross-member stationary, while either no exposure takes place or only less precise structures are exposed when the guide cross-member is moving.

In order additionally to allow the guide cross-member to move in a simple manner, it is provided that the guide cross-member can be moved in the second direction by means of at least one feed drive which is located on the machine frame.

In principle, any desired type of feed drive of this kind may be provided. An advantageous solution provides for the at least one feed drive to be a linear drive. A linear drive of this kind may, for example, be a driven threaded spindle with a spindle nut.

However, it is particularly advantageous for the linear drive to be in the form of an electric linear motor which on the one hand allows good dynamics and on the other hand allows sufficiently high positioning accuracy.

A particularly advantageous solution provides that a controller is provided for movement of the guide cross-member in the second direction, the controller carrying out a movement of the guide cross-member in the second direction in the form of a feed movement, followed by a feed pause.

In this case, it is preferably provided that the controller fixes the guide cross-member relative to the machine frame in the feed pause, in order to provide, in the feed pause, a connection between the guide cross-member and the machine frame which is as stiff as possible.

A particularly precise method of operation in this case provides for a precise exposure of the photosensitive coating of the substrate body to be effected in the feed pauses.

In this case, exposure of a photosensitive coating of large extent is preferably effected in such a manner that the controller moves the guide cross-member continuously in a repeated sequence of feed movement followed by feed pause, and at least the precise exposure of the photosensitive coating is in each case carried out in the feed pause.

For example, it would be conceivable likewise to allow exposures with less stringent precision requirements during the feed movement while exposures with stringent precision requirements are carried out only in the feed pauses.

No further details have yet been provided with regard to the feed drives in conjunction with the feed pauses. An advantageous solution provides that the feed drive can be switched off in the feed pause.

In order to maintain the defined alignment of the guide cross-member in the feed pause, it is preferably provided that the feed drive can be switched off when the guide cross-member is fixed on the machine frame.

In order to allow the positioning of the guide cross-member to be maintained by the feed drive while the guide cross-member is fixed to the machine frame, it is preferably provided that the feed drive can be controlled in a standstill control mode while the guide cross-member is fixed on the machine frame, in which standstill control mode no excessive control forces or control overshoots which would adversely affect the precision of the positioning of the guide cross-member occur, despite force-fitting fixing of the guide cross-member.

On the other hand, the feed drive can be controlled during the movement of the guide cross-member in a movement control mode in which movement dynamics that are as good as possible can be achieved for the movement of the guide cross-member during the course of the feed movement.

No further details have yet been provided with regard to the adjustability of the exposure spots relative to the guide cross-member. An advantageous solution therefore provides that the position of the exposure spots relative to the guide cross-member can be adjusted in the second direction. This allows the exposure spots to also be adjusted relative to the guide cross-member when this is at a standstill.

In this case, it is particularly advantageous for the position of the exposure spots relative to the guide cross-member to be adjustable by means of a controllable positioning device.

In order to obtain precise recordal of the adjustment by the positioning device, it is particularly advantageous if the positioning device is coupled to a measurement system for the adjustability of the exposure spots in the second direction.

In this case, an advantageous solution provides that the positioning device acts on the optics unit, and therefore moves the optics unit as a whole in the second direction.

In this case, it is particularly advantageous if the positioning device positions the optics unit relative to a carriage frame of the guide carriage, and therefore provides the adjustment capability in the second direction.

Alternatively or in addition to this, an advantageous exemplary embodiment provides that the positioning device positions a fiber optic loom relative to imaging optics in the second direction.

In order to ensure that the positioning device still has the capability to correct positioning errors during movement of the optics unit, it is preferably provided that the dynamic positioning of the exposure spots in the second direction can be effected in the course of the movement of the exposure spots in the first direction.

No further details have yet been provided with regard to the movement of the at least one guide carriage in the first direction. An advantageous solution provides that the at least one guide carriage can be moved in the first direction along the guide cross-member by means of a dynamic movement shaft.

It is particularly advantageous if the at least one guide carriage can be moved backwards and forwards continuously, that is to say in an oscillating manner, in the first direction along the guide cross-member by means of the dynamic movement shaft, in order to ensure that the photosensitive coating is exposed as efficiently as possible.

In this case, it is particularly advantageous if the at least one guide carriage can be moved in the first direction along the guide cross-member by a linear drive.

A linear drive of this kind may be a linear drive with a threaded spindle. It is particularly advantageous if the at least one guide carriage can be moved in the first direction relative to the guide cross-member by an electric linear motor.

No further details have likewise yet been provided with regard to the guidance of the at least one guide carriage on the guide cross-member. An advantageous solution therefore provides that the at least one guide carriage is guided laterally on the guide cross-member.

It is also advantageous if the at least one guide carriage is guided on an upper face, facing away from the substrate carrier surface, of the guide cross-member.

No further details have likewise been provided with regard to the bearing mounting of the at least one guide carriage. In principle, a conventional bearing could be provided. A particularly advantageous solution provides that the at least one guide carriage is guided on the guide cross-member by means of air bearings.

No further details have yet been provided either with regard to the configuration of the at least one guide carriage. A particularly advantageous solution provides that the at least one guide carriage has a guide frame which can be moved along the guide cross-member in the first direction and is guided on the guide cross-member.

In particular, it is advantageous in this case if the at least one guide carriage has a mounting frame, which can be moved relative to the guide frame, for the optics unit, in such a way as to allow the optics unit to be positioned in a simple manner relative to the guide frame.

In a further advantageous solution, the mounting frame can be adjusted relative to the guide frame in a third direction, which runs transversely with respect to the substrate carrier surface.

The mounting frame is in this case preferably configured such that the mounting frame is guided on the guide frame by air guides, to be movable in the third direction.

In order to maintain the positioning of the mounting frame relative to the guide frame, it is preferably provided that the mounting frame can be fixed to the guide frame.

Fixing of this kind can be implemented in various ways. An advantageous solution provides that the mounting frame can be fixed to the guide frame by switching off the air guides.

No further details have yet been provided with regard to the arrangement of the radiation sources relative to the exposure device and to the guide carriage. In principle, it would be conceivable to locate the radiation sources on the guide carriage.

However, because of the heat that is developed in the region of the radiation sources, it is advantageous if the radiation sources of the exposure device are not disposed on the guide carriage.

In this case, it is particularly advantageous if the radiation sources are disposed in a radiation source generating unit which is located to one side of the guide cross-member.

No further details have yet been provided with regard to the arrangement of the radiation-generating unit to the side of the guide cross-member. For example, it would be conceivable to locate the radiation-generating unit in a stationary manner and to transfer the radiation for the optics unit to the guide carriage via a flexible link.

However, a particularly advantageous solution provides that the radiation-generating unit can be moved with the guide cross-member in the second direction.

In this case, the radiation-generating unit may be guided on the guide cross-member.

However, it is particularly advantageous if the radiation-generating unit is guided on separate guides provided for the radiation-generating unit.

However, in order to allow the movements of the guide cross-member to be followed in a simple manner, it would on the one hand be conceivable to also move the radiation-generating unit by way of the movement of the guide cross-member.

However, this would have the disadvantage that additional forces would act on the guide cross-member.

For this reason, the invention provides that the radiation-generating unit can be moved in the second direction by a linear drive.

In this case, a particularly advantageous solution provides that the radiation-generating unit can be moved on guides which are located outside the machine frame.

The radiation-generating unit can be disposed in a particularly advantageous manner by locating it at the side, alongside an end face of the guide cross-member.

In order to allow the radiation from the radiation sources to be supplied in an optimum manner to the optics unit, it is preferably provided that a flexible fiber optic loom is brought from the radiation-generating unit to the optics unit.

In this case, the flexible fiber optic loom is preferably brought in a drag guide which is provided on the guide cross-member and leads to the respective guide carriage.

The drag guide can be particularly expediently provided on the guide cross-member if the drag guide runs in an accommodating region which is provided on the guide cross-member.

In this case, the accommodating region is, in the simplest case, in the form of a channel provided on the guide cross-member.

It is particularly advantageous if one end of the fiber optic loom can be positioned relative to imaging optics by means of an adjustable positioning device, in such a way that as to allow the fiber optic loom to be adjusted relative to the imaging optics.

The positioning device is expediently configured such that it allows at least one exposure spot, which is produced by the imaging optics, to be moved on the photosensitive coating in at least one direction parallel to a surface of the coating.

It is even more advantageous if the positioning device is formed so that it allows the at least one exposure spot, which is produced by the imaging optics, to be moved on the photosensitive coating in two directions which are parallel to the surface of the coating and run transversely with respect to one another.

This allows the position of the exposure spot on the photosensitive coating to be adjusted in a simple manner.

A further embodiment also provides that the end of the fiber optic loom can be moved by the positioning device relative to the imaging optics in such a manner that the diameter of the at least one exposure spot which can be produced on the photosensitive coating can be varied.

It is also advantageous for the imaging optics to be provided with an autofocussing system.

No further details have yet been provided with regard to the specific embodiment of the positioning devices. For example, it would be possible to use any form of actuating drives, for example mechanical actuating drives with threaded spindles or toothed rods.

A particularly advantageous solution provides that the positioning devices comprise piezo drives as actuating drives.

In connection with the explanation so far of the exemplary embodiments, it has been detailed only that the guide cross-member carries at least one guide carriage.

However, a particularly expedient solution provides that two guide carriages are mounted on the guide cross-member. The provision of two guide carriages opens up a multiplicity of further options, for example increased exposure flexibility, possibly higher exposure power or else better moment compensation, in order to achieve exposure precision that is as high as possible despite the movement of the guide carriages.

In order to achieve operation that is as free of moments as possible, it is particularly advantageous for the guide cross-member to carry a guide carriage on each opposite side in the second direction.

In this case, the two guide carriages can expediently be moved synchronously in the first direction.

A synchronous method such as this can be achieved by the guide carriages being movable in opposite directions in the first direction, in order to allow equalization of momentum to be achieved.

Another advantageous solution provides that the guide carriages can be moved parallel in the first direction.

For better equalization of momentum, in particular for parallel guide carriages, it provided that a balance weight can be moved on the guide cross-member in the opposite direction to the at least one guide carriage, thus allowing equalization of momentum to be achieved.

By way of example, the balance weight may also be disposed on the outside of the guide cross-member.

A particularly advantageous solution provides that the balance weight is guided to be movable in a guide channel which is provided in the guide cross-member.

By way of example, it would be feasible to provide a mechanical coupling, for example via gearbox elements, for the movement of the balance weight. A solution which is particularly expedient and can be used advantageously provides that the balance weight is driven by a linear drive, with the linear drive in the simplest case being in the form of an electric linear motor.

Particularly expedient equalization of momentum is provided in that the balance weight can be moved synchronously and in the opposite direction to the at least one guide carriage or to both guide carriages.

No further details have yet been provided with regard to the location of the optics unit when two guide carriages are used. In this context, an advantageous exemplary embodiment provides that one of the guide carriages carries an optics unit, and one of the guide carriages carries a balance weight which corresponds to the weight of the optics unit, thus allowing good moment compensation to be achieved, in order to improve the exposure precision.

However, if the aim is to improve the exposure power, then it is preferably provided that each of the guide carriages carries an optics unit. This solution allows high precision since moments can be compensated for by the weights and, on the other hand, the exposure power can be increased by using two optics units for simultaneous exposure.

No further details have yet been provided with regard to the air bearings.

An advantageous embodiment provides that the air bearings are in the form of air bearings which are loaded in the support direction.

The air bearings are preferably loaded by a magnetic loading device.

No further details have yet been provided with regard to the recording of the position of the optics unit. In this context, an advantageous solution provides that a measurement system is provided which continuously records the position of the optics unit in the first direction during the movement of the optics unit.

Furthermore, a measurement system is also preferably provided which records the position of the optics unit in the second direction during movement of the optics unit.

The measurement system is in this case preferably in the form of an optical measurement system.

A particularly advantageous solution provides that the position of the optics unit can be recorded interferometrically in the first direction and in the second direction.

The position of the optics unit is preferably recorded in that the position of the mounting frame which carries the optics unit can be recorded interferometrically.

No further details have yet been provided with regard to the control of the movement of the exposure spots. In this context, a particularly advantageous solution provides that a controller is provided for the dynamic movement of the exposure spots and, by means of a calibration run in the first direction, records the movement profile of the optics unit along a real path which is predetermined by the guidance on the guide cross-member.

A real path such as this preferably does not ideally extend parallel to the first direction, but deviates from it.

For this reason, it is advantageous if the controller records any deviation between the real path which is predetermined by the guide cross-member and the path in the first direction which is theoretically predetermined for the exposure, so that it is possible for the controller to identify the extent to which the real path deviates from the theoretically predetermined path.

It is particularly advantageous in this case, when the controller, together with the dynamic positioning device which acts in the second direction, corrects the movement of the exposure spots such that they move on the theoretically predetermined path of the optics unit which is moved in the first direction.

A correction such as this makes it possible to maintain the theoretically predetermined path within the limits of the positioning accuracy, and therefore to correct for all types of deviations, for example, by inaccurate linear movement or inclined positions of the guide cross-member.

Furthermore, an advantageous solution provides that each exposure spot can be moved by the controller a plurality of times in the second direction, by means of the positioning device which acts in the second direction, and can be moved parallel to the first direction, in the new position, in each case in the second direction. This makes it possible to carry out the exposure on the photosensitive coating in a region which extends in the first direction and in the second direction when the guide cross-member is stationary, for example during a feed pause, thus allowing an exposure to be carried out, for example, in a multiplicity of rows which are alongside one another in the second direction and extend in the first direction, for example when the guide cross-member is at a standstill.

Further features and advantages of the invention are the subject matter of the following description and of the drawing illustration of an exemplary embodiment.

BRIEF DESCRIPTION OF THE DRAWINGS

FIG. 7 shows a plan view of a receiving unit;

FIG. 8 shows a side view of the receiving unit in the direction of the arrow 6 in FIG. 7;

FIG. 9 shows an illustration similar to FIG. 8, with an enlarged illustration of the regions D and E in FIG. 8;

DETAILED DESCRIPTION OF THE INVENTION

Figure 1:
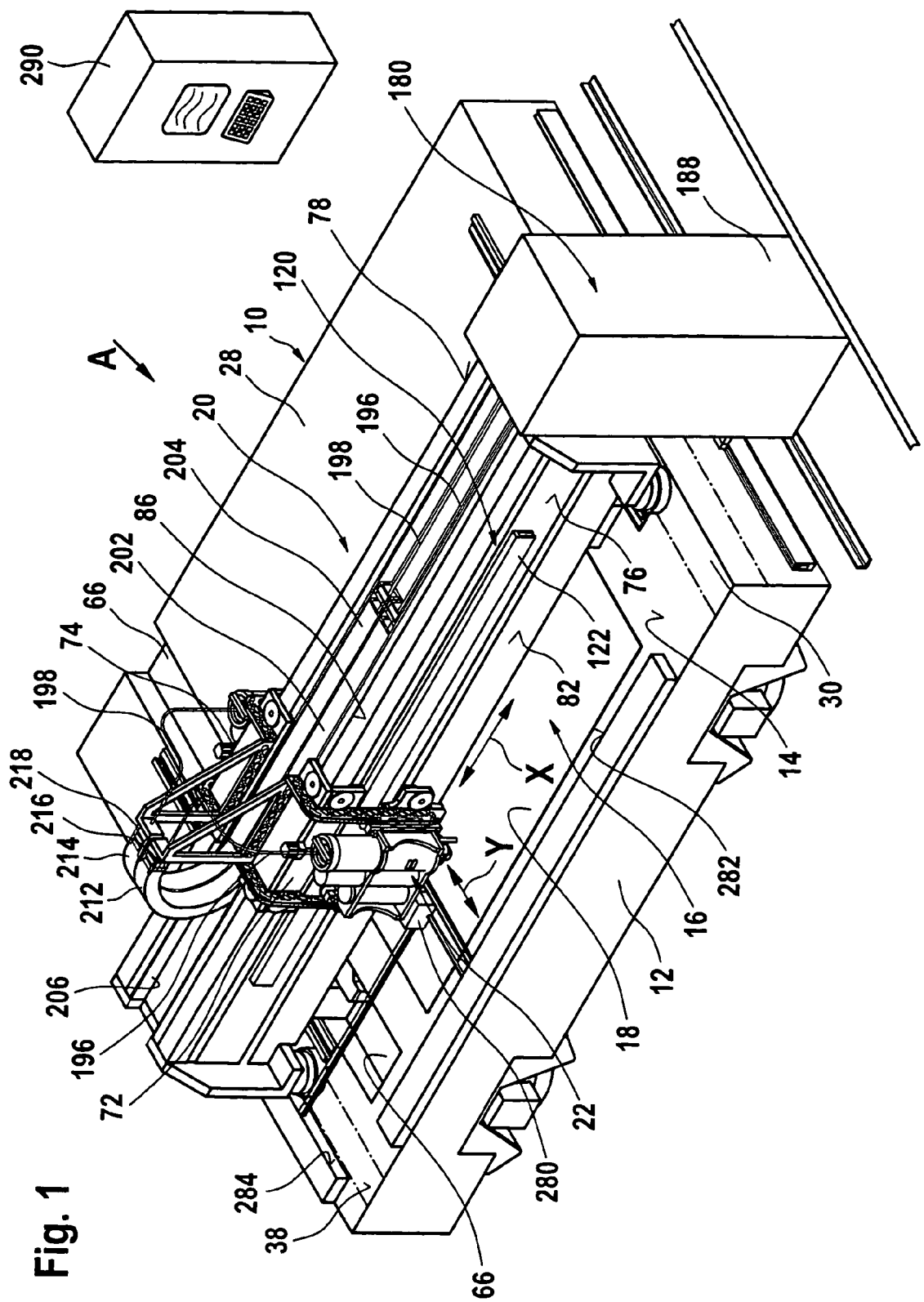
FIG. 1 shows a perspective illustration of an exemplary embodiment of an exposure system according to the invention.

A first exemplary embodiment, which is illustrated in FIG. 1, of an exposure system according to the invention comprises a machine frame 10 which has a substrate carrier 12 which is provided with a substrate carrier surface 14, on which a substrate body, which is designated 16 as a whole, can be placed, in order to allow a photosensitive coating 18 which is carried by this substrate body and is disposed on a face of the substrate body 16 directed away from the substrate carrier surface 14 to be exposed.

An exposure device which is designated 20 as a whole is provided for this purpose and, as is illustrated in FIG. 1, has an optics unit 22 which can be moved relative to the machine frame 10 and therefore also relative to the substrate carrier 12 in a first direction X, which runs parallel to the substrate carrier surface 14, and in a second direction Y, which is likewise parallel to the substrate carrier surface 14, in order to allow structures to be produced by the exposure process on the entire photosensitive coating 18 by selective exposure and therefore conversion of the photosensitive coating.

Figure 2:
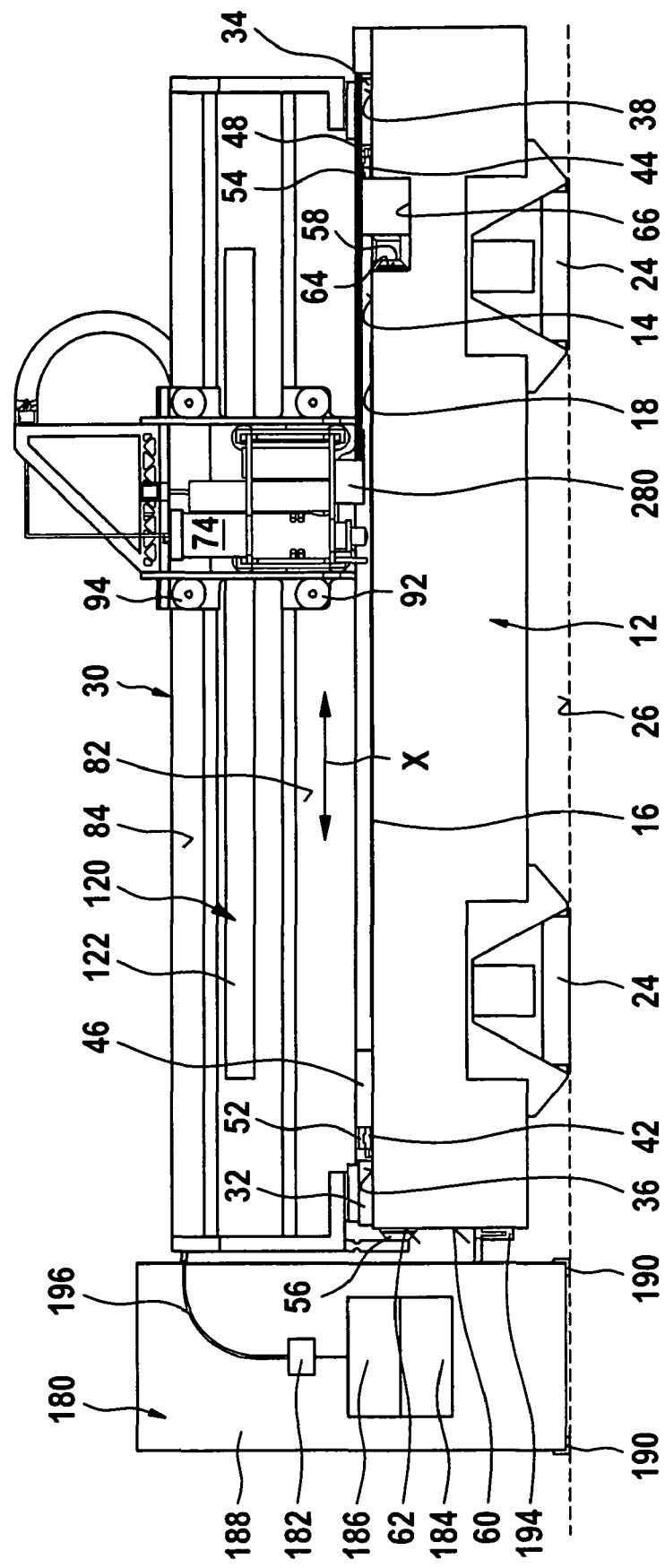
FIG. 2 shows a view in the direction of the arrow A in FIG. 1.

As illustrated in FIG. 2, the substrate carrier 12 is formed from a solid block of a material with a high relative density, low thermal expansion and high stiffness and freedom from distortion, for example granite. Granite is also therefore advantageous because it represents a mass with a high damping effect, on account of its high relative density.

In addition, granite is also a distortion-free material which can be machined with high precision and can be supported by means of damping feet elements, preferably air-sprung feet elements 24, on a base surface 26, for example a floor of a room in which the exposure system is positioned, such that no oscillations are transmitted from the floor to the substrate carrier 12 via the feet elements 24, but are damped by virtue of the high mass of the substrate carrier 12, and the feet elements 24.

A guide cross-member, which is designated 30 as a whole, is arranged on the machine frame 10, in particular at a spacing from an upper face 28 of the substrate carrier 12 and also surrounded by the exposure device 20, extends over the substrate body 16 at a spacing from the substrate carrier surface 14 and at a spacing from the photosensitive coating 18, and in this case preferably runs parallel to the first direction X.

For the same reasons as those stated for the substrate carrier 12, the guide cross-member 30 is produced from a material with low thermal expansion and high stiffness and freedom from distortion, in particular granite.

The guide cross-member 30 is in this case supported on both sides of the substrate carrier surface 14 by feet elements 32, 34 on running surfaces 36, 38 which are provided on the substrate carrier 12 and extend parallel to the second direction Y.

The running surfaces 36, 38 are in this case, for example, in the form of ground and polished surfaces provided on the substrate carrier 12.

The feet elements 32, 34 are configured such that they produce an air cushion on the running surfaces 36, 38, so that the feet elements 32, 34 slide, supported by air bearings, over the running surfaces 36, 38 for movement of the guide cross-member 30 along the running surfaces 36, 38.

Stators 42, 44 of electrical linear motors, which are designated 46, 48 as a whole, are provided parallel to the running surfaces 36, 38 on the substrate carrier 12, with an actuator 52, 54 of these linear motors 46, 48 being fixedly connected to the guide cross-member 30, such that the guide cross-member 30 can be driven in the second direction Y by these electric linear motors 46, 48.

The linear motors 46, 48 are in this case preferably provided with their own position measurement system and can be driven such that they provide active parallel guidance for the guide cross-member 30, so that the guide cross-member 30 can be actively moved by the linear motors 46, 48, aligned parallel to the first direction X.

In order also to ensure that the guide cross-member 30 is aligned parallel to the first direction X by a separate guide, in particular when active parallel guidance is no longer provided by the linear motors 46, 48, mutually facing guide elements 56, 58 are provided on both sides of the substrate carrier surface 14, with the guide elements 56 engaging against a running surface 62, which is likewise in the form of a ground and polished surface on the substrate carrier 12 and is provided on an end surface 60 which runs transversely with respect to the substrate carrier surface 14, while the guide elements 58 engage against a running surface 64, which likewise extends transversely with respect to the substrate carrier surface 14 but is in the form of a side wall of a sunken region 66, which extends into the substrate carrier 12 from its upper face 28 and, for example, extends between the running surface 38 and the substrate carrier surface 14.

The guide elements 56 and 58, which interact with the running surfaces 62, 64, are likewise preferably in the form of guide elements of air guides which ensure precise guidance of the guide cross-member 30 in the second direction Y by virtue of their acting in opposite directions parallel to the first direction X, at least one of the guide elements 56, 58 also being guided in the second direction Y over an adequate guide length on the respective running surface 62 or 64, and therefore also ensuring adequate stiffness of the guidance of the guide cross-member 30 against slewing out of the parallel orientation with respect to the first direction X, in a plane parallel to the substrate carrier surface 14.

Figure 3:
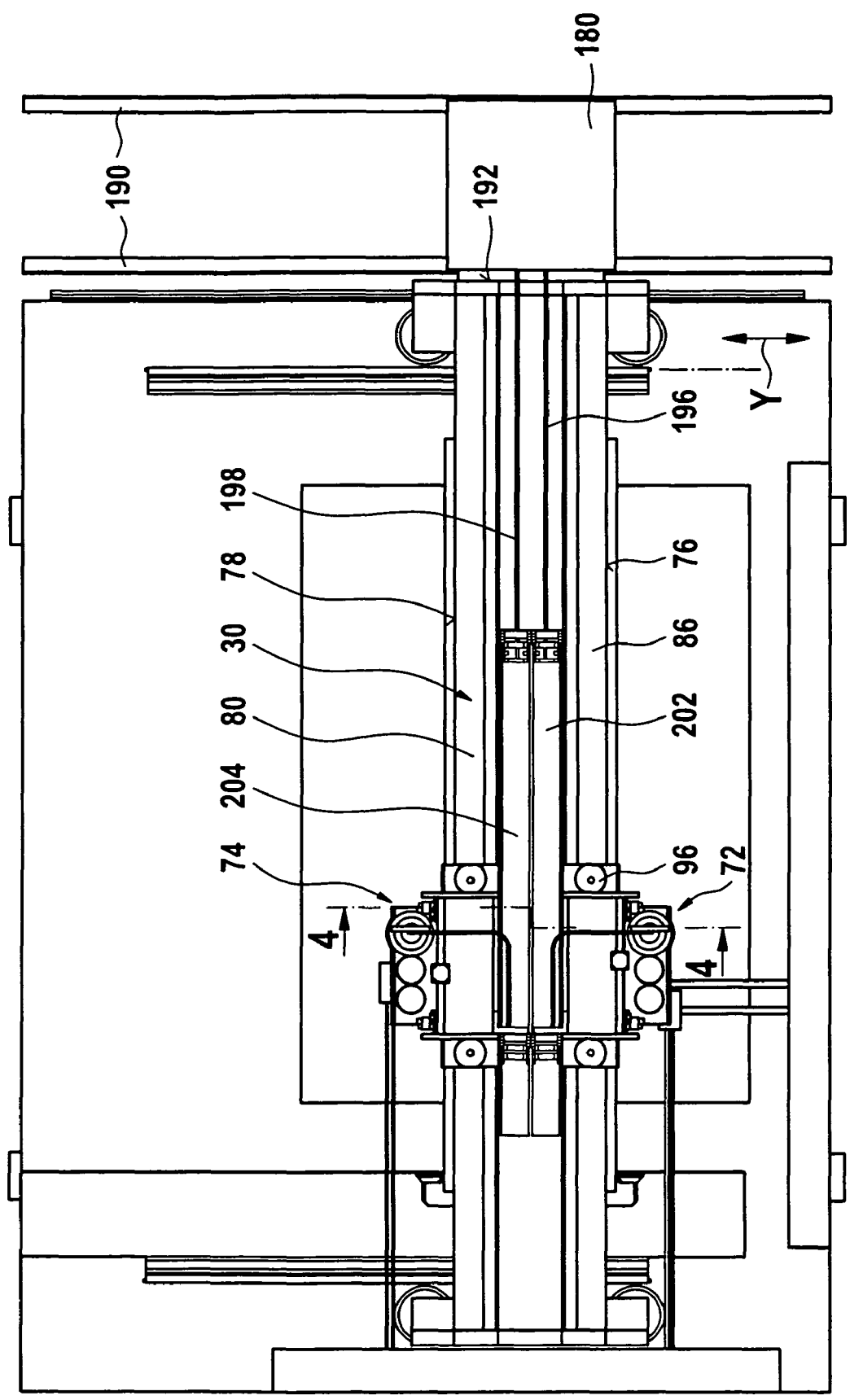
FIG. 3 shows a plan view in the direction of the arrow B in FIG. 2.

As illustrated in FIGS. 1, 2 and 3, two guide carriages 72 and 74 are guided on the guide cross-member 30, each of the guide carriages 72, 74 being slidingly guided by means of running surfaces 82, 84 and 86, which are located on side surfaces 76, 78 of the guide cross-member 30 that run transversely with respect to the substrate carrier surface 14 and parallel to the first direction X, and on a surface 80 of the guide cross-member 30 which faces away from the substrate carrier surface 14 and runs parallel to the first direction X, the running surfaces 82, 84 and 86 having corresponding guide elements 92, 94 and 96, and the guide elements 92, 94 and 96 being supported on the running surfaces 82, 84, 86 via air cushions which are produced by the guide elements 92, 94 and 96.

Figure 4:
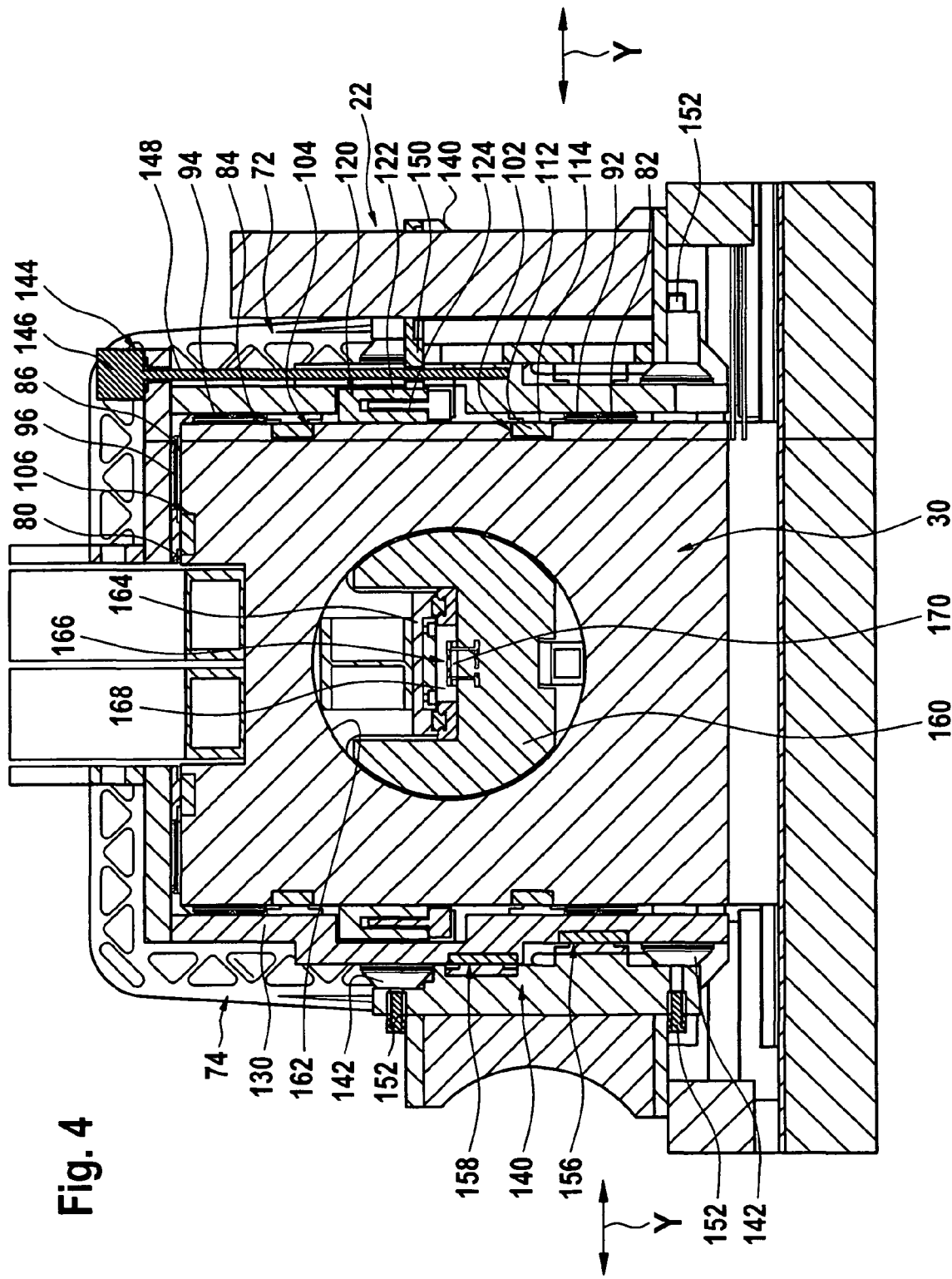
FIG. 4 shows a section along the line 4-4 in FIG. 3.

In this case, as is illustrated in FIG. 4, there is associated with each of the pairs comprising a guide element and running surface 92, 82; 94, 84; 96, 86, a magnetic loading device 102, 104, 106, each of which comprises a magnetic strip 112, which is mounted on the guide cross-member 30, and a magnet body 114, which is mounted on the respective guide carriage 72, 74, these interacting in such a way that a force effect is produced in the respective pair comprising a guide element and a running surface 92, 82; 94, 84; 96, 86 so that the respective guide element 92, 94, 96 has a constant force applied to it in the direction of the respective running surface 82, 84, 86.

At least one of the magnetic strips 112 or of the magnet bodies 114 preferably comprises a permanent magnet composed of magnetically hard material.

The respective guide carriages 72, 74 are therefore acted on in the direction of the respective side surfaces 76, 78, and additionally in the direction of the surface 80 of the guide cross-member 30, and are thus reliably guided on the guide cross-member 30 along the side surfaces 76, 78 and the surface 80.

In order to move the guide carriages 72, 74 parallel to the longitudinal direction of the guide cross-member 30 and therefore in the first direction X, an electric linear motor is provided in each case, this being designated 120 as a whole and comprising a stator 122, which is disposed on the respective side surface 76, 78, as well as an armature 124, which is held fixedly on the respective guide carriage 72, 74 and, for example, engages in the stator 122.

By way of example, a linear drive such as this is located between the running surfaces 82 and 84.

Figure 5:
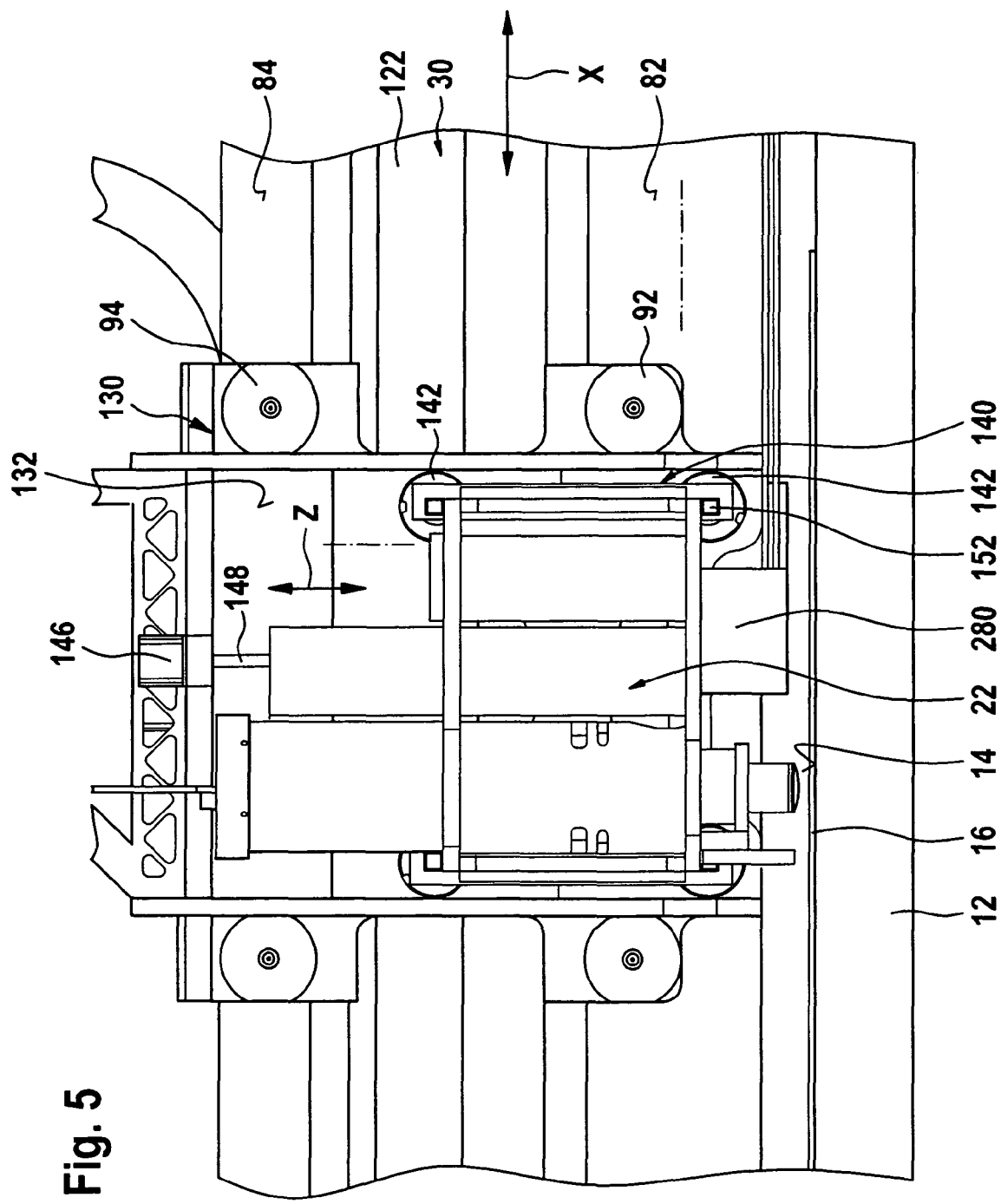
FIG. 5 shows an enlarged illustration of a detail of an optics unit with a guide carriage as shown in FIG. 2.

As illustrated in FIGS. 4 and 5, each of the guide carriages 72, 74 comprises a guide frame 130 which is guided directly on the guide cross-member 30 such that it can move in the first direction X, the guide frame 130 in each case having two guide elements 92, 94 and 96 for each of the running surfaces 82, 84, 86, which guide elements 92, 94 and 96 are disposed at a spacing from one another in the first direction X, engage against the respective running surfaces 82, 84, 86 and thus guide the guide frame 130, supported with respect to the guide cross-member 30.

The guide frame 130 also carries the magnet bodies 114 of the loading devices 102, 104, 106, which act on each of the guide carriages 72, 74, as well as the respective armature 124. However, the optics unit 22 is not disposed directly on the guide frame 130 but on a mounting frame 140 which can also be moved relative to the guide frame 130 in a third direction Z, which runs at right angles to the substrate carrier surface 14.

For this purpose, the guide frame 130 likewise comprises running surfaces 132 which run parallel to the third direction Z, guide elements 142 which are connected to the mounting frame 140 engaging on these surfaces and being slidingly movable relative to the surfaces.

The guide elements 142 are also preferably guide elements of air guides which are supported via an air cushion on the running surfaces 132, in order to allow the guide elements 142 to be moved, in a sliding manner, relative to the running surfaces 132.

Two guide elements 142, which are disposed at a spacing from one another, are preferably provided in the third direction Z on each of the running surfaces 132, and two running surfaces 132, which run at a spacing from one another, are also provided in the first direction X on the guide frame 130, on which running surfaces 132 the corresponding guide elements 142 are then supported.

A linear drive 144 is provided on the guide frame 130 in order to move the mounting frame 140 in the third direction Z and comprises a drive motor 146 as well as a threaded spindle 148, the threaded spindle 148 interacting with a spindle nut 150, which is fixedly connected to the mounting frame 140, in order to move the mounting frame 140 in the third direction Z.

This capability to move the mounting frame 140 relative to the guide frame 130 allows the height of the optics unit 22 to be adjusted relative to the substrate body 16 and in particular relative to a surface 154, directed away from the substrate body 16, of a photosensitive coating 18 on the substrate body 16, and in particular allows the position of the optics unit 22 above the photosensitive coating 18 to be preset to match the respective thickness of the substrate body 16.

The position of the optics unit 22 is in this case preset once, by means of the linear drive 144, at the start of an exposure process, to match the respective substrate body 16, in particular its thickness, and the mounting frame 140 is then fixed relative to the guide frame 130. By way of example, this can be done by the guide elements 142 no longer producing an air cushion in order to fix the mounting frame 140 relative to the guide frame 130, so that the guide elements 142 are seated by a friction lock on the running surfaces 132 and in the process are additionally pressed by a magnetic loading device 156, 158 against the running surfaces 132, so that the mounting frame 140 can be fixed via the guide elements 142 with a friction lock on the running surfaces 132, and therefore relative to the guide frame 130.

In addition to the capability of the mounting frame 140 to be moved in the third direction Z, the mounting frame 140 can also be moved in the second direction Y with respect to the guide frame 130.

For this purpose, the guide elements 142 can be moved parallel to the second direction Y relative to the respective mounting frame 140 via a positioning device 152, and the entire mounting frame 140 can therefore also be moved in the second direction relative to the respective guide frame 130. The positioning devices 152 preferably comprise piezo drives with a built-in position measurement system, so that the position of the mounting frame 140 relative to the guide frame 130 can be fixed in a precisely controlled manner.

In addition to the two guide carriages 72 and 74, a balance weight, which is designated 160 as a whole, is also guided on the guide cross-member 30 such that it can move parallel to the first direction X.

For this purpose, the guide cross-member 30 is provided with a guide channel 162 which extends in the longitudinal direction of the guide cross-member 30 and therefore of the first direction X, and in which a longitudinal guide 164 runs, on which the balance weight 160 is movably guided.

Furthermore, there is also associated with the longitudinal guide 164 a linear motor 166, which comprises a stator 168, which is mounted on the longitudinal guide 164, as well as an actuator 170, which is mounted on the balance weight 160, so that the balance weight 160 can be moved in a controlled manner along the longitudinal guide 164.

The exposure device 20 also comprises a radiation-generating unit 180, which comprises a multiplicity of radiation sources 182 as well as radiation source supply units 184 and a radiation source controller 186, which are located in a housing 188 that is disposed alongside the end surface 60, the surface 60 extending parallel to the second direction Y, and the housing 188 being beside the machine frame 10 and being guided to be movable in the second direction Y on guides 190 which run parallel to the second direction Y and are disposed on the base surface 26.

The housing 188 is preferably disposed so that, as can be seen in particular in FIGS. 1 and 3, it can also be moved with the guide cross-member 30 in the second direction Y in the region of an end face 192 of the guide cross-member 30.

By way of example, a linear drive 194, preferably in the form of an electric linear motor, is provided for this purpose on the end surface 60, by means of which the housing 188 can be moved approximately synchronously with the guide cross-member 30 and parallel to the second direction Y.

Fiber optic strands 196 and 198 lead from the multiplicity of radiation sources 182 to flexible cable carriers 202 and 204 which on the one hand are guided in an accommodating region 206 in the guide cross-member 30, the accommodating region 206 extending from the surface 80 of the guide cross-member 3 into the cross-member, as a sunken region, and on the other hand run via deflecting curves 212 and 214 to ends 216 and 218 which are coupled to the guide carriages 72 and 74, and from which the fiber optic strands 196 and 198 again emerge and run towards the optics units 22, so that the radiation generated by each of the multiplicity of radiation sources 182 can be supplied thereto, with the radiation sources 182 preferably being laser units, in particular semiconductor laser units, and producing laser radiation whose intensity can be controlled in a defined manner by the radiation source controller 186.

Figure 6:
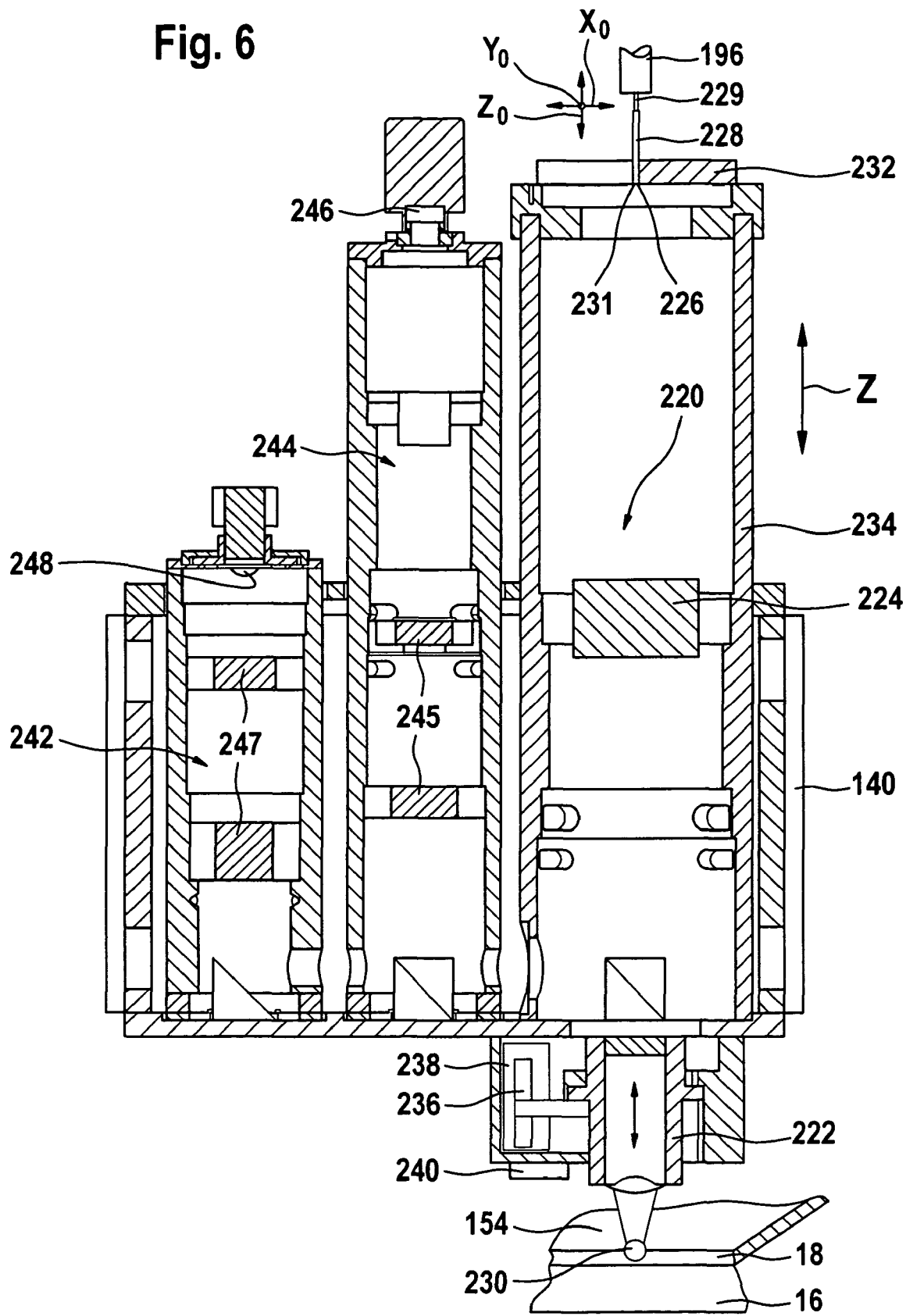
FIG. 6 shows a longitudinal section through the optics unit in FIG. 5.

As is illustrated in FIG. 6, each optics unit 22 comprises imaging optics 220 which are disposed on the mounting frame 140 and can thus be moved in the third direction Z.

The imaging optics 220 themselves comprise a lens 222 which, in conjunction with a lens system 224 of the imaging optics 220, is able to image individual radiation emitting surfaces 226 of a receiving unit 228 for individual optical fibers 229 of the fiber optic loom 196 which is brought to this optics unit 22, in a focused manner onto the photosensitive coating 18 as individual exposure spots 230, with the exposure spots 230 normally having a diameter of a few hundred nanometers.

In this case, the imaging optics 220 preferably image a total of approximately 50 to approximately 1000 radiation emitting surfaces 226, which are arranged in a defined pattern, in particular in a row 231 which preferably runs approximately parallel to the second direction Y, into corresponding exposure spots 230, which are arranged in a corresponding pattern, at the same time, with each of the radiation emitting surfaces 226 preferably being coupled to a radiation source 182 which is provided for it and whose intensity can be controlled individually.

In order to allow the position of the exposure spots 230 on the photosensitive coating 18 to be finely controlled, the totality of the receiving unit 228 which has the radiation emitting surfaces 226 can be moved by means of a positioning device, which is designated 232 as a whole, relative to the lens system 224 and relative to the lens 222 in a first direction $X_0$, and if required also in a second direction $Y_0$ and even in the third direction $Z_0$.

In this case, the positioning device 232 is preferably seated on a housing 234, which holds the lens system 224, of the imaging optics 220 and allows the receiving unit 228 and therefore the radiation emitting surfaces 226 provided thereon to move relative to the housing 234.

If the $X_0$ axis and the $Y_0$ axis run parallel to the first axis X and to the second axis Y, then movement of the exposure spots 230 on the photosensitive coating 18 in these directions can be directly achieved by the positioning device 232, therefore, for example, also allowing corrections to the positions of the exposure spots 230 in the first direction X and in the second direction Y to be effected directly by the positioning device 232.

On the one hand, this allows one-off adjustment of the position of the exposure spots 230 relative to the mounting frame 140 to be carried out by the positioning device 232. However, it is also conceivable to dynamically adjust the position of the exposure spots 230 in the first direction X or in the second direction Y by means of the positioning device 232, in order, for example, to compensate for deviations from linear movement of the optics unit 22 in the first direction X or the second direction Y.

A displacement of the radiation emitting surfaces 226 in the third direction $Z_0$ also makes it possible to compensate for any deviation from an optimum focus and therefore for any defocusing, since, in contrast to optimum focusing, defocusing would result in the exposure spots 230 having a larger diameter on the photosensitive coating 18, or penetrating to a lesser depth into the photosensitive coating 18, with poorer interaction.

It is even more advantageous for the positioning device 232 to also allow rotation or tilting of the receiving unit 228 and therefore of the pattern, in particular of the row 231, about the $Z_0$ direction, the $X_0$ direction and the $Y_0$ direction, thus allowing all of the radiation emitting surfaces 226 to be tilted in one direction, and providing an additional optimum adjustment capability for the entire imaging optics 220 relative to the radiation emitting surfaces 226.

In order to maintain optimum focusing of the laser beams on the individual exposure spots 230 by the lens 222, the lens can also be adjusted relative to the lens system 224, and thus with respect to the housing 234, by means of an adjusting element 236, so that the distance between the lens 222 and the surface 154 of the photosensitive coating 18 can be readjusted continuously.

An autofocussing system 238 is provided for this purpose, which uses a sensor 240 to record the distance from the photosensitive coating 18 and, by driving the actuating element 236, positions the lens 222 at the optimum focus distance from the surface 154 of the photosensitive coating 18, with this being done during movement of the imaging optics 220.

The imaging optics 220 also have associated illumination optics 242 and observation optics 244, which are all coupled to the imaging optics 220 such that it is possible to illuminate the photosensitive coating 18 in the region of the exposure spots 230 and to observe the photosensitive coating 18 in the region of the exposure spots 230.

By way of example, for this purpose, the observation optics 244 are provided with imaging elements 245 and with a camera chip 246, via which the exposure spots 230 can be observed through the microscope optics 222.

Furthermore, the illumination optics 242 have a long-wave light source 248 and imaging elements 247, and it is also possible for the light source 248 to be an end surface of an optical fiber, so that the light for the illumination optics 242 can likewise be brought via the fiber optic loom 196 from the radiation-generating unit 180.

As illustrated by way of example in FIG. 7, the receiving unit 228 for the individual optical fibers 229 comprises a base 250 on which a mounting plate 254 is placed, in an end region 252, the plate having a multiplicity of depressions 256, for example grooves, in which the individual optical fibers 229 can be placed, and thus fixed.

Individual end surfaces 258 of the individual optical fibers 229 are in this case located in the row 231 which extends in a direction 260, preferably running parallel to the second direction Y, and is predetermined by the fixed arrangement of the individual optical fibers 229, with the end surfaces 258 being positioned precisely in the receiver 254.

A divergent radiation field emerges from the individual end surfaces 258, with each individual divergent radiation field which emerges from one of the end surfaces 258 being formed by a collimation lens 262, individually associated with it, into a collimated radiation field.

The collimated radiation field is coupled by means of cylinder optics 264 into a waveguide 270 which, for example, is in the form of a film waveguide, and emerges therefrom again, with further cylinder optics 266 being provided, once again forming a collimated radiation field which, by means of a telescope 271 formed from the elements 272 and 274, generates an emerging collimated radiation field 276, which then enters the lens system 224.

In this case, the element 274 has the radiation emitting surface 226, which can be positioned relative to the imaging optics 220 by movement of the entire receiving unit 228.

In the described solution, both the mounting plate 254 and the collimation lenses 262, the cylinder optics 264 and 266 as well as the elements 272 and 274 of the telescope 271, are seated on the base 250 and are disposed fixedly relative thereto.

In particular, the collimation lenses 262 and the cylinder optics 264 and 266 as well as the elements 272 and 274 of the telescope 271 are each combined to form microlens arrays, and are positioned fixedly on the base 250.

The waveguide 270 is, in particular, also in the form of an electro-optical deflection unit, by means of which the respective individual radiation can be deflected in a direction 278 which runs parallel to the direction 260 and preferably likewise parallel to the second direction Y.

For a row of exposure spots 230, the deflection in the direction 278 therefore allows each individual exposure spot 230 to be moved in the direction of the next exposure spot 230 in the row, and therefore, by suitable control of the deflection in the direction 278, also allows the photosensitive coating 18 to be exposed in the intermediate spaces between the non-deflected exposure spots 230, when the deflection unit is not active.

In a simplified solution, in which there is no need to have the capability to deflect the radiation in the direction 278, the cylinder optics 264 and 266 as well as the waveguide 270 may be omitted.

In order to record precisely the position of the optics unit 22 relative to the substrate body 16 and relative to the substrate carrier 12, an interferometer head 280 is disposed on the mounting frame 140, which is fixedly connected to the optics unit 22, and this interferometer head 280 is able to determine precisely the position of the mounting frame 140, and therefore of the optics unit 22 as well, relative to the substrate carrier 12 (FIG. 1).

In this case, the interferometer head 280 interacts with a mirror surface 282, which is illustrated in FIGS. 1 and 2, extends parallel to the first direction X and is located fixedly on the substrate carrier 12, and with a mirror surface 284 which extends parallel to the second direction Y and is located fixedly on the substrate carrier 12, such that the interferometer head 280 can in each case interferometrically determine the distance from the respective mirror surface 282 and/or 284.

A controller which is designated 290 as a whole is provided in order to operate the exposure system according to the invention and is able to control the position of the exposure spots 230 on the photosensitive coating 18, and the radiation intensity impinging on the coating.

Exposed structures are produced, for example, by the basic principle of relative movement of the optics unit and substrate body 16 with photosensitive coating 18, as described in WO 98/00760. A better way for exposure of the photosensitive coating 18 is described in EP 1 319 984 A2, and an even better solution is described in WO 2004/029721 A2. Reference is therefore made to the entire contents of these documents for production of the exposed structures, the configuration of the imaging optics and the detailed method of operation.

The movement of the optics unit 22 in conjunction with the controlled local exposure of the photosensitive coating 18 can be controlled by the controller 290, with the controller 290 automatically carrying out the exposure of the photosensitive coating 18, in conjunction with the movement of the optics unit 22, in accordance with the shape and size requirements for the exposed structure.

In this case, the exposure system according to the invention operates, for example, as follows:

Once a substrate body 16 with a photosensitive coating 18 has been placed on the substrate carrier surface 14, the thickness of the substrate body 16 with the photosensitive coating 18 is recorded, and the position of the mounting frame 140 is therefore adjusted in the third direction Z, with the mounting frame 140 being moved relative to the guide frame 130, for which purpose the guide elements 142 are activated such that they produce an air cushion between themselves and the running surfaces 132, by means of which the mounting frame 140 can be moved by virtue of the linear drive 144 in the third direction Z, therefore making it possible to preset the distance between the microscope optics 222 and the photosensitive coating 18.

Once the preset position has been reached, the mounting frame 140 is fixed on the guide frame 130 such that, on the one hand, the position is maintained by means of the linear drive 144 while, on the other hand, the guide elements 142 no longer produce an air cushion and are therefore seated with a friction lock on the running surfaces 132, although preferably still loaded with force from the magnetic loading devices 156, 158, which apply a force to the mounting frame 140 in the direction of the guide frame 130, with the guide elements 142 therefore engaging on the running surfaces 132, with force applied.

Before the exposure of the photosensitive coating 18 commences, the guide cross-member 30 is positioned by moving it so that the photosensitive coating 18 can be exposed in a predetermined region by at least one of the optics units 22.

The feet elements 32, 34 are activated for this purpose so that they produce an air cushion between themselves and the running surfaces 36, 38, and the guide cross-member 30 can in consequence be moved in the second direction Y.

Furthermore, the guide elements 56, 58 are activated and likewise produce an air cushion between themselves and the running surfaces 62, 64 in order in this way to guide the guide cross-member 30 in a direction parallel to the second direction Y, in a precise manner relative to the substrate carrier 12, in particular in order to prevent any movement of the guide cross-member 30 in the first direction X and slewing of the guide cross-member 30 from a position parallel to the first direction X to a position which runs at an angle to the first direction X.

The guide cross-member 30 can therefore be moved by a feed movement to the desired position, for example a position in which the optics unit 22 of one of the guide carriages 72, 74 or the optics units 22 of both guide carriages 72, 74 is/are able to apply exposure spots 230 to, and thus to expose, the photosensitive coating 18.

In this case, the guide cross-member 30 is moved with the assistance of the linear motors 46, 48, which extend in the second direction Y.

In the illustrated exemplary embodiment, on reaching a suitable position, the guide cross-member 30 now carries out a feed pause during which the guide cross-member 30 is fixed relative to the substrate carrier 12 such that the feet elements 32 and 34 are made ineffective, that is to say the production of the air cushion is switched off, so that the feet elements 32, 34 are set down onto the running surfaces 36, 38 and, as a result of the friction arising in this case, fix the feet elements 32, 34 with a friction lock on the running surfaces 36, 38, and therefore relative to the substrate carrier 12.

For the time period which is required to dissipate the air cushions and to set the feet elements 32, 34 down onto the running surfaces 36, 38, the linear motors 46, 48 are switched from a movement control mode, which is intended for movement thereof, to a standstill control mode, which, although it is suitable for maintaining the position that has been reached, nevertheless prevents any excessive current rise and/or control oscillations when the feet elements 32, 34 start to be fixed by a force fit on the running surfaces 36, 38.

Once the feet elements 32, 34 have been completely fixed with a friction lock on the running surfaces 36, 38, the electric linear motors 46, 48 are then switched off.

The fixing of the guide cross-member 30 relative to the substrate carrier 12 therefore results in an initial position of the guide cross-member 30 in which the photosensitive coating 18 can be exposed.

In this case, the guide carriages 72, 74 are first of all moved in the first direction X over the entire substrate body 16 in a calibration run, and the interferrometer heads 280 are used during the course of this calibration run to record the extent to which the optics unit 22 on its own is moved parallel to the first direction X by the guidance of the guide carriages 72, 74 on the guide cross-member 30.

In the event of any minor misorientation, for example twisting of the guide cross-member 30, then, as is illustrated in FIG. 9, a movement of the optics unit 22, in this case of the interferometer head 280, along a path 292 is detected, which for example deviates by an angle $\alpha$ from a direction parallel to the first direction X, the first direction X being predetermined by the interferometrically scanned mirror surface 282.

If, as is illustrated in FIG. 9, the path 292 deviates from the first direction X by an oblique path comprising a movement in the second direction Y, then this deviation can be determined by computation, and can be corrected by a correction value KY for the position of the optics unit 22 in the second direction Y.

The correction value KY can in this case be used either to drive the positioning devices 152 by which the position of the mounting frame 140 relative to the guide frame 130 can be varied in the second direction Y. However, it is also conceivable to use this correction value KY to drive the positioning device 232 by means of which the exposure spots 230 can likewise be displaced in the second direction Y.

Figure 10:
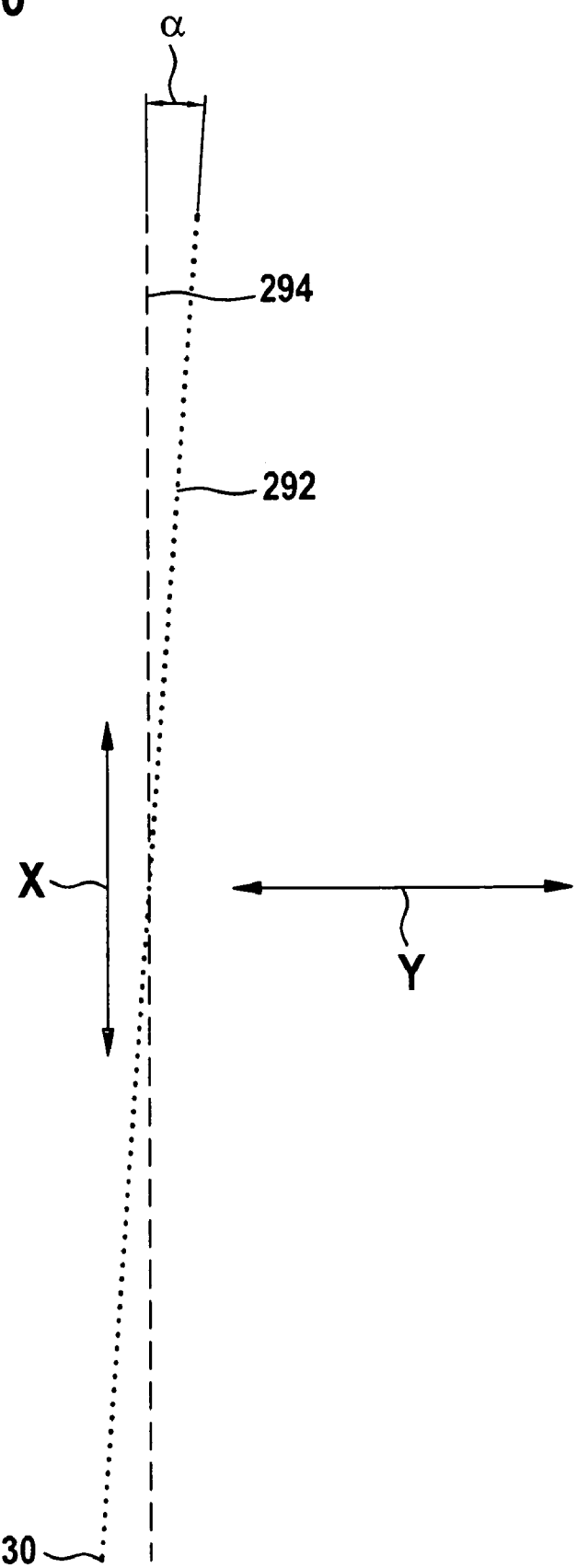
FIG. 10 shows a schematic illustration of a real path, traversed by an exposure spot, in comparison to a predetermined path which runs parallel to the first direction.

The positioning devices 152 are preferably driven so that, depending on the position of the respective optics unit 22 along the first direction X, the position thereof is corrected by displacement in the second direction Y, so that a movement of the optics unit 22 over the substrate body 16 in the first direction X leads to a corrected path 294, as is illustrated in FIG. 10, this corrected path 294 running parallel to the first direction X, within the limits of the measurement accuracy of the interferometer head 280.

However, the correction value KY can be used not only to correct for an oblique path 292 relative to the first direction X but also to correct for a curved or wavelike profile so that the corrected path 294, which runs in a straight line within the limits of measurement accuracy, is achieved for the optics unit 22 during the movement of the optics unit 22 over the substrate body 16.

Figure 11:
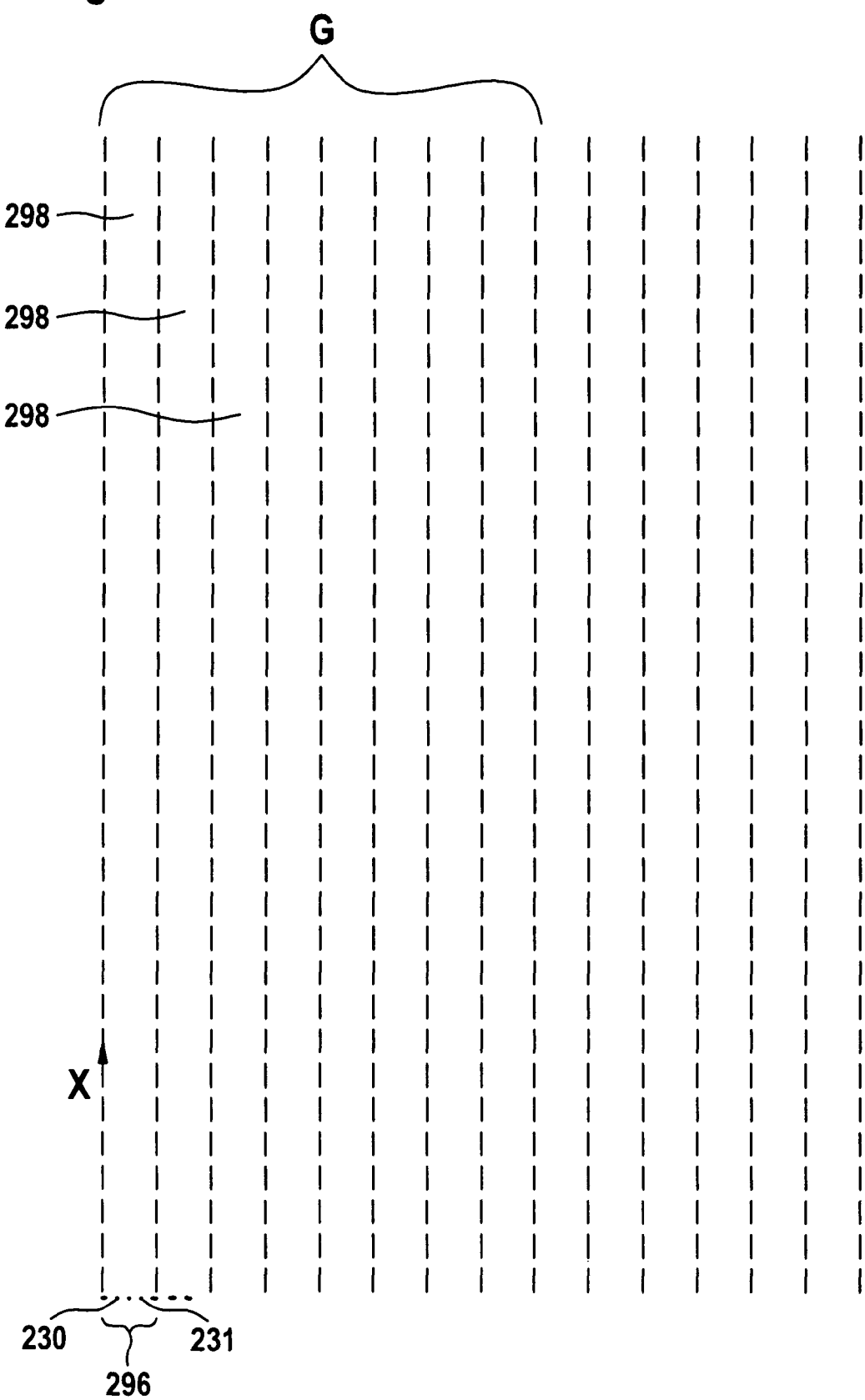
FIG. 11 shows a schematic illustration of how a photosensitive coating is exposed in the case of the first exemplary embodiment.

As is illustrated schematically in FIG. 11 using the example of five exposure spots 230, once the calibration run has been carried out, the multiplicity of exposure spots 230 which are located alongside one another in the direction of the row 231, with this multiplicity being predetermined by the number of optical fibers 196 located alongside one another in the receiving unit 228, are moved over the substrate body 16, in the first direction X, the multiplicity of exposure spots located in the row 231 representing a simultaneously moved set 296 of exposure spots 230, and the multiplicity comprising approximately 50 to 1000 exposure spots 230, so that the rows which are comprised within a macro row 298 can be exposed with the set 296 of exposure spots 230. In this case, the movement in the first direction X for exposure of the rows within a macro row 298 is carried out by movement of the respective guide carriage 72, 74 along the guide cross-member 30 in a first movement direction $X_1$ in the first direction X, followed by a movement in the second direction Y being carried out to change to a different macro row 298, which can be carried out by suitably driving the positioning devices 152 or 232, and, following the exposure of the rows in the next macro row 298, movement in a second movement direction $X_2$ in the first direction X, the second movement direction $X_2$ running in the opposite direction to the first movement direction $X_1$. Thus, overall, when the guide cross-member 30 is at rest on the substrate carrier 12, all of the exposure steps which are required for exposure of the photosensitive coating 18 can be carried out within a group G of macro rows 298 which are directly adjacent to one another and are located alongside one another, in order to obtain the desired exposed structure in the photosensitive coating 18. The number of macro rows 298 included in the group G is in this case dependent on the path possible for the positioning devices 152, 232.

The advantage of the solution according to the invention is in this case that the greatest possible precision can be achieved as a result of the fact that the guide cross-member 30 is disposed to be stationary relative to the substrate carrier 12 during the exposure processes, and the movements in the second direction Y take place only by driving the positioning devices 152 or 232.

The interferometer head 280 can record directly the precise position of the optics unit 22, with the positioning devices 152 being driven, and can measure precisely the position of the mounting frame 140 relative to the mirror surfaces 282 and 284 and, when the positioning device 232 is being driven, its internal travel measurement system can be used in addition to the position data determined by the interferometer head 280.

After the exposure within the group G of macro rows 298 which are located immediately alongside one another, the exposure process is adjusted and the guide cross-member 30 is then moved in the second direction Y.

For this purpose, the feet elements 32 and 34 as well as the guide elements 56 and 58 are activated, so that the guide cross-member 30 can once again be moved in the second direction Y, supported by air cushions. During the activation of the guide elements 56 and 58, the linear motors 46 and 48 are driven in their standstill control mode, and they are then switched to the movement control mode, in which the guide cross-member 30 can be moved in a controlled manner in the second direction Y to the next position, in which, once again, the guide cross-member 30 is fixed relative to the substrate carrier 12 by placing the feet elements 32, 34, with a friction lock, on the running surfaces 36, 38 in order then once again to expose the photosensitive coating 18 after carrying out a calibration process, during the course of which the next group G of rows 298 which are located alongside one another and are directly adjacent to one another is dealt with, with the guide cross-member 30 being fixed relative to the substrate carrier 12.

As an alternative to this, it is also conceivable to move the guide cross-member 30 by means of the feet elements 32, 34 supported by air, over the running surfaces 36, 38 in the second direction Y at low speed, while an exposure process is carried out continuously by movement of the optics unit 22 in the first direction X. However, this procedure has the disadvantage that it is less precise.

Furthermore, no more detailed statements relating to the movement of the guide carriages 72 and 74 have been made in conjunction with the previous description of the exposure process.

When using two guide carriages 72 and 74, one preferred embodiment provides for both guide carriages 72 and 74 to be moved synchronously with the optics units 22 seated on them, and in the same sense in the first direction X. In this case, acceleration forces which occur in this case and act on the guide cross-member 30 are compensated for by movement in opposite senses, and in particular acceleration of the balance weight 160 in the guide channel 162, driven by the linear motor 166.

As an alternative to this, it would be conceivable, when using two guide carriages 72, 74, to move them synchronously but in opposite senses, in which case, however, torques would act on the guide cross-member 30, and would have a negative effect on the precision of the guidance of the guide carriages in the first direction X.

Figure 12:
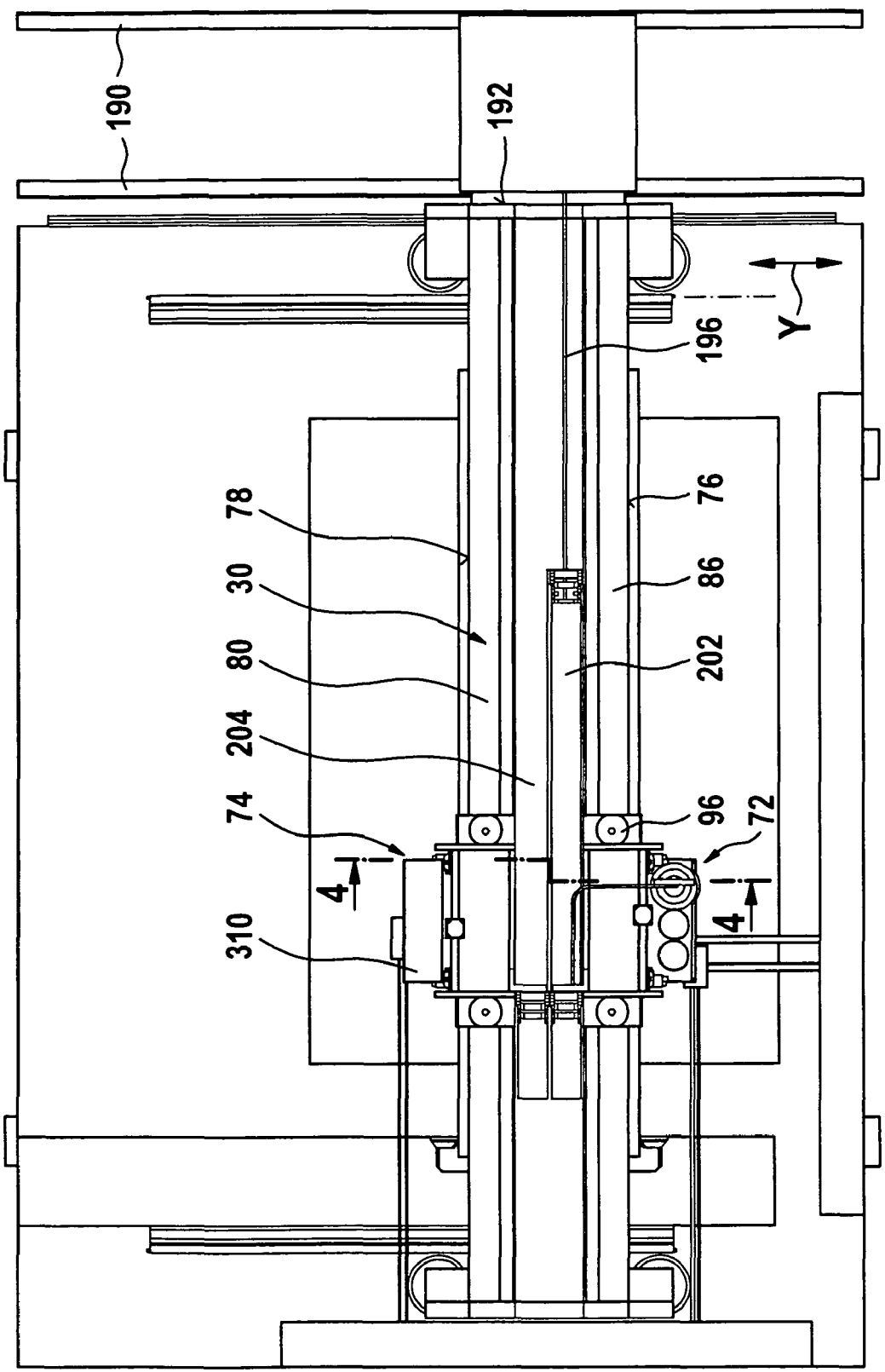
FIG. 12 shows a plan view, similar to FIG. 3, of a second exemplary embodiment.

In a second exemplary embodiment, illustrated in FIG. 12, the respectively used optics unit 22 is disposed on one of the guide carriages 72, 74, and a balance weight 310 which corresponds to the mass of the optics unit is on the other of the guide carriages 74, 72, so that the precision of guidance in the first direction X can be improved by the movement of the two guide carriages 72, 74.

Apart from this, the second exemplary embodiment corresponds to the first exemplary embodiment, so that the same reference symbols are used for the same parts, and in this context reference is made to the entire content of the statements relating to the first exemplary embodiment.

The invention claimed is:

1. Exposure system for substrate bodies which carry a photosensitive coating on a substrate surface, comprising:
   a machine frame,
   a substrate carrier which carries a substrate body and has a substrate carrier surface, and
   an exposure device comprising at least one radiation source and an optics unit,
   the optics unit and the machine frame being movable relative to one another in a first direction, which is parallel to the substrate carrier surface, and in a second direction, which is parallel to the substrate carrier surface and runs transversely with respect to the first direction, so that the photosensitive coating can be exposed locally selectively by means of exposure spots, which can be produced by means of the optics unit, by virtue of the relative movement in the first direction and in the second direction, the exposure device having a guide cross-member for at least one guide carriage of the exposure device, the at least one guide carriage carrying the optics unit but not carrying the at least one radiation source, the at least one guide carriage being guided on the guide cross-member to be movable in the first direction, the guide cross-member being arranged on the machine frame to be movable in the second direction, the at least one radiation source of the exposure device being disposed in a radiation-generating unit located to one side of the guide cross-member, the radiation-generating unit being guided on guides provided for the radiation-generating unit, which guides are separate from the guide cross member and at least one guide carriage of the exposure device, and the radiation-generating unit being movable with the guide cross-member in the second direction.

2. Exposure system according to claim 1, wherein the guide cross-member is movably mounted on the machine frame by means of feet elements, which form air bearings.

3. Exposure system according to claim 1, wherein the guide cross-member is fixable relative to the machine frame against movement in the second direction.

4. Exposure system according to claim 3, wherein the guide cross-member is fixable on the machine frame by setting feet elements down onto the machine frame.

5. Exposure system according to claim 4, wherein:
the feet elements of the guide cross-member form air bearings,
the air bearings are adapted to be switched off in order for the feet elements to be set down onto running surfaces on the machine frame, which are provided for the feet elements.

6. Exposure system according to claim 4, wherein the feet elements which are set down onto the machine frame fix the guide cross-member with a force fit relative to the machine frame.

7. Exposure system according to claim 1, wherein the guide cross-member is fixable relative to the machine frame in order to effect an exposure of the photosensitive coating.

8. Exposure system according to claim 1, wherein the guide cross-member is movable in the second direction by means of at least one feed drive which is located on the machine frame.

9. Exposure system according to claim 8, wherein the at least one feed drive is a linear drive.

10. Exposure system according to claim 1, wherein:
a controller is provided for movement of the guide cross-member in the second direction, and
the controller carries out a movement of the guide cross-member in the second direction in the form of a feed movement, followed by a feed pause.

11. Exposure system according to claim 10, wherein the controller fixes the guide cross-member relative to the machine frame in the feed pause.

12. Exposure system according to claim 10, wherein a precise exposure of the photosensitive coating on the substrate body is effected in the feed pauses.

13. Exposure system according to claim 10, wherein the feed drive is adapted to be switched off in the feed pause.

14. Exposure system according to claim 13, wherein the feed drive is adapted to be switched off when the guide cross-member is fixed on the machine frame.

15. Exposure system according to claim 14, wherein the feed drive is adapted to be controlled in a standstill control mode while the guide cross-member is fixed on the machine frame.

16. Exposure system in accordance with claim 1, wherein a position of the exposure spots relative to the guide cross-member is adjustable in the second direction.

17. Exposure system according to claim 16, wherein the position of the exposure spots relative to the guide cross-member is adapted to be adjusted by means of a controllable positioning device.

18. Exposure system according to claim 17, wherein the controllable positioning device is coupled to a measurement system for the adjustability of the exposure spots in the second direction.

19. Exposure system according to claim 17, wherein the positioning device acts on the optics unit.

20. Exposure system according to claim 19, wherein the positioning device positions the optics unit relative to a carriage frame of the guide carriage.

21. Exposure system according to claim 17, wherein the positioning devices comprise piezo drives as actuating drives.

22. Exposure system according to claim 16, wherein the positioning device positions a fiber optic loom relative to imaging optics in the second direction.

23. Exposure system according to claim 17, wherein dynamic positioning of the exposure spots in the second direction is effected by the positioning device in the course of the movement of the exposure spots in the first direction.

24. Exposure system according to claim 1, wherein the at least one guide carriage is adapted to be moved in the first direction relative to the guide cross-member by means of a dynamic movement shaft.

25. Exposure system according to claim 24, wherein the at least one guide carriage is movable in an oscillating manner in the first direction along the guide cross-member by means of the dynamic movement shaft.

26. Exposure system according to claim 24, wherein the at least one guide carriage is movable in the first direction along the guide cross-member by a linear drive.

27. Exposure system according to claim 24, wherein the at least one guide carriage is movable by a linear motor relative to the guide cross-member in the first direction.

28. Exposure system according to claim 1, wherein the at least one guide carriage is guided laterally on the guide cross-member.

29. Exposure system according to claim 1, wherein the at least one guide carriage is guided on an upper face, facing away from the substrate carrier surface, of the guide cross-member.

30. Exposure system according to claim 1, wherein the at least one guide carriage is guided by means of air bearings on the guide cross-member.

31. Exposure system according to claim 1, wherein the at least one guide carriage has a guide frame which is movable along the guide cross-member in the first direction and is guided on the guide cross-member.

32. Exposure system according to claim 31, wherein the at least one guide carriage has a mounting frame, which is movable relative to the guide frame, for the optics unit.

33. Exposure system according to claim 32, wherein the mounting frame is adapted to be adjusted relative to the guide frame in a third direction, which runs transversely with respect to the substrate carrier surface.

34. Exposure system according to claim 33, wherein the mounting frame is guided on the guide frame by air guides, to be movable in the third direction.

35. Exposure system according to claim 34, wherein the mounting frame is adapted to be fixed to the guide frame.

36. Exposure system according to claim 1, wherein the radiation-generating unit is movable in the second direction by a linear drive.

37. Exposure system according to claim 1, wherein the radiation-generating unit is movable on guides which are located outside the machine frame.

38. Exposure system according to claim 37, wherein the radiation-generating unit is located at the side, alongside an end face of the guide cross-member.

39. Exposure system according to claim 1, wherein at least one flexible fiber optic loom is brought from the radiation-generating unit to the optics unit.

40. Exposure system according to claim 39, wherein the flexible fiber optic loom is brought in a drag guide which is provided on the guide cross-member and leads to the at least one guide carriage.

41. Exposure system according to claim 40, wherein the drag guide runs in an accommodating region which is provided on the guide cross-member.

42. Exposure system according to claim 41, wherein the accommodating region is in the form of a channel which is provided in the guide cross-member.

43. Exposure system according to claim 39, wherein one end of the fiber optic loom is adapted to be positioned relative to imaging optics by means of an adjustable positioning device.

44. Exposure system according to claim 43, wherein the positioning device is adapted to allow at least one exposure spot, which is produced by the imaging optics, to be moved on the photosensitive coating in at least one direction parallel to a surface of the coating.

45. Exposure system according to claim 44, wherein the positioning device is adapted to allow the at least one exposure spot, which is produced by the imaging optics, to be moved on the photosensitive coating in two directions which are parallel to the surface of the coating and run transversely with respect to one another.

46. Exposure system according to claim 43, wherein an accommodating unit for the fiber optic loom is movable by the positioning device relative to the imaging optics in such a manner that a diameter of the at least one exposure spot which can be produced on the photosensitive coating can be varied.

47. Exposure system according to claim 1, wherein imaging optics of the optics unit are provided with an autofocussing system.

48. Exposure system according to claim 1, wherein two guide carriages are disposed on the guide cross-member.

49. Exposure system according to claim 48, wherein the guide cross-member carries a guide carriage on each opposite side in the second direction.

50. Exposure system according to claim 48, wherein the guide carriages are movable synchronously in the first direction.

51. Exposure system according to claim 48, wherein the guide carriages are movable in opposite directions in the first direction.

52. Exposure system according to claim 48, wherein the guide carriages are movable parallel in the first direction.

53. Exposure system according to claim 48, wherein a balance weight is movable on the guide cross-member in an opposite direction to the at least one guide carriage.

54. Exposure system according to claim 53, wherein the balance weight is guided to be movable in a guide channel which is provided in the guide cross-member.

55. Exposure system according to claim 53, wherein the balance weight is driven by a linear drive.

56. Exposure system according to claim 48, wherein the balance weight is movable synchronously and in an opposite direction to the at least one guide carriage.

57. Exposure system according to claim 48, wherein one of the guide carriages carries an optics unit, and one of the guide carriages carries a balance weight which corresponds to the weight of the optics unit.

58. Exposure system according to claim 48, wherein each of the guide carriages carries an optics unit.

59. Exposure system according to claim 2, wherein the air bearings are in the form of air bearings which are loaded in the support direction.

60. Exposure system according to claim 59, wherein the air bearings are loaded by a magnetic loading device.

61. Exposure system according to claim 1, further comprising a measurement system which continuously records a position of the optics unit in the first direction during the movement of the optics unit.

62. Exposure system according to claim 61, wherein the measurement system is an optical measurement system.

63. Exposure system according to claim 1, further comprising a measurement system which continuously records a position of the optics unit in the second direction during the movement of the optics unit.

64. Exposure system according to claim 1, wherein a position of the optics unit is recordable interferometrically in the first direction and in the second direction.

65. Exposure system according to claim 64, wherein a position of the mounting frame which carries the optics unit is recordable interferometrically.

66. Exposure system in accordance with claim 1, further comprising a controller for controlling a dynamic movement of the exposure spots and, by means of a calibration run in the first direction, the controller records a movement profile of the optics unit along a path which is predetermined by the guidance on the guide cross-member.

67. Exposure system according to claim 66, wherein the controller records any deviation between the path which is predetermined by the guide cross-member and the path in the first direction which is theoretically predetermined for the exposure.

68. Exposure system according to claim 67, wherein the controller, together with a dynamic positioning device which acts in the second direction, corrects the movement of the exposure spots such that they move on the theoretically predetermined path of the optics unit which is moved in the first direction.

69. Exposure system according to claim 1, wherein each exposure spot is movable by the controller a plurality of times in the second direction, by means of the positioning device which acts in the second direction, and is movable parallel to the first direction, in a respective new position in the second direction.

70. Exposure system for substrate bodies which carry a photosensitive coating on a substrate surface, comprising:
a machine frame,
a substrate carrier which carries a substrate body and has a substrate carrier surface, and
an exposure device with at least one radiation source and an optics unit,
the optics unit and the machine frame being movable relative to one another in a first direction, which is parallel to the substrate carrier surface, and in a second direction, which is parallel to the substrate carrier surface and runs transversely with respect to the first direction, so that the photosensitive coating can be exposed locally selectively by means of exposure spots, which can be produced by means of the optics unit, by virtue of the relative movement in the first direction and in the second direction, the exposure device having a guide cross-member for at least one guide carriage of the exposure device, the at least one guide carriage carrying the optics unit but not carrying the at least one radiation source, the at least one guide carriage being guided on the guide cross-member to be movable in the first direction, the guide cross-member being arranged on the machine frame to be movable in the second direction, the at least one radiation source of the exposure device being disposed in a radiation-generating unit located to one side of the guide cross-member, at least one flexible fiber optic loom running from the radiation-generating unit to the optics unit, the flexible fiber optic loom being brought in a drag guide which is provided on the guide cross-member and leads to the at least one guide carriage, the drag guide running in an accommodating region which is provided on the guide cross-member, and the accommodating region being in the form of a channel which is provided in the guide cross-member.

71. Exposure system according to claim 70, wherein the radiation-generating unit is movable with the guide cross-member in the second direction.

72. Exposure system according to claim 71, wherein the radiation-generating unit is guided on guides provided for the radiation-generating unit, which guides are separate from the guide cross member and at least one guide carriage of the exposure device.

73. Exposure system according to claim 70, wherein one end of the fiber optic loom is adapted to be positioned relative to imaging optics by means of an adjustable positioning device.

74. Exposure system according to claim 73, wherein the positioning device is adapted to allow at least one exposure spot, which is produced by the imaging optics, to be moved on the photosensitive coating in at least one direction parallel to a surface of the coating.

75. Exposure system according to claim 74, wherein the positioning device is adapted to allow the at least one exposure spot, which is produced by the imaging optics, to be moved on the photosensitive coating in two directions which are parallel to the surface of the coating and run transversely with respect to one another.

76. Exposure system according to claim 73, wherein an accommodating unit for the fiber optic loom is movable by the positioning device relative to the imaging optics in such a manner that a diameter of the at least one exposure spot which can be produced on the photosensitive coating can be varied.

* * * * *